United States Patent
Horikiri et al.

(10) Patent No.: US 11,967,617 B2
(45) Date of Patent: *Apr. 23, 2024

(54) NITRIDE SEMICONDUCTOR SUBSTRATE, LAMINATE, SUBSTRATE SELECTION PROGRAM, SUBSTRATE DATA OUTPUT PROGRAM, OFF-ANGLE COORDINATE MAP, AND METHODS THEREOF

(71) Applicant: SUMITOMO CHEMICAL COMPANY, LIMITED, Tokyo (JP)

(72) Inventors: Fumimasa Horikiri, Hitachi (JP); Takehiro Yoshida, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 1032 days.

This patent is subject to a terminal disclaimer.

(21) Appl. No.: 16/759,004

(22) PCT Filed: Aug. 8, 2018

(86) PCT No.: PCT/JP2018/029720
§ 371 (c)(1),
(2) Date: Aug. 27, 2020

(87) PCT Pub. No.: WO2019/082472
PCT Pub. Date: May 2, 2019

(65) Prior Publication Data
US 2021/0184003 A1 Jun. 17, 2021

(30) Foreign Application Priority Data
Oct. 27, 2017 (JP) .................................. 2017-208139

(51) Int. Cl.
*C30B 29/38* (2006.01)
*C23C 16/34* (2006.01)
(Continued)

(52) U.S. Cl.
CPC .......... *H01L 29/2003* (2013.01); *C23C 16/34* (2013.01); *C30B 25/18* (2013.01);
(Continued)

(58) Field of Classification Search
CPC .......... C30B 25/18; C30B 29/38; C30B 29/40; C23C 16/14; H01L 21/02293; H01L 21/02389; H01L 21/02433; H01L 29/2003
See application file for complete search history.

(56) References Cited

U.S. PATENT DOCUMENTS 6,413,627 B1 7/2002 Motoki et al.
9,209,021 B2 * 12/2015 Okuno ................ H01L 21/0254
(Continued)

FOREIGN PATENT DOCUMENTS

| | | |
|---|---|---|
| JP | 2000-022212 A | 1/2000 |
| JP | 2005-056979 A | 3/2005 |

(Continued)

OTHER PUBLICATIONS

International Searching Authority, "International Search Report," issued in connection with International Patent Application No. PCT/JP2018/029720, dated Oct. 30, 2018.
(Continued)

*Primary Examiner* — Robert M Kunemund
(74) *Attorney, Agent, or Firm* — Foley & Lardner LLP

(57) ABSTRACT

A nitride semiconductor substrate including a group III nitride semiconductor crystal and having a main surface, wherein a low index crystal plane is (0001) plane curved in a concave spherical shape to the main surface, and the off-angle ($\theta_m$, $\theta_a$) at a position (x, y) in the main surface approximated by x representing a coordinate in a direction along <1-100> axis, y is a coordinate in a direction along <11-20> axis, (0, 0) represents a coordinate (x, y) of the center, $\theta_m$ represents a direction component along <1-100>
(Continued)

axis in an off-angle of <0001> axis with respect to a normal, $\theta_a$ represents a direction component along <11-20> axis in the off-angle, $(M_1, A_1)$ represents a rate of change in the off-angle $(\theta_m, \theta_a)$ with respect to the position (x, y) in the main surface, and $(M_2, A_2)$ represents the off-angle $(\theta_m, \theta_a)$ at the center.

24 Claims, 14 Drawing Sheets

(51) Int. Cl.
 C30B 25/18 (2006.01)
 C30B 29/40 (2006.01)
 H01L 21/02 (2006.01)
 H01L 29/20 (2006.01)

(52) U.S. Cl.
 CPC .............. *C30B 29/38* (2013.01); *C30B 29/40* (2013.01); *H01L 21/02293* (2013.01); *H01L 21/02389* (2013.01); *H01L 21/02433* (2013.01)

(56) References Cited

U.S. PATENT DOCUMENTS

| | | | |
|---|---|---|---|
| 10,312,409 B2* | 6/2019 | Li | ...................... H01L 21/02458 |
| 2002/0137249 A1* | 9/2002 | Ishida | ................. H01L 21/0262 |
| | | | 257/E21.127 |
| 2005/0026398 A1 | 2/2005 | Nakamura | |
| 2005/0224783 A1 | 10/2005 | Matsuyama et al. | |
| 2008/0308814 A1 | 12/2008 | Nakahata et al. | |
| 2013/0292688 A1* | 11/2013 | Ueno | ...................... C30B 25/18 |
| | | | 257/76 |
| 2017/0352721 A1 | 12/2017 | Iso et al. | |

FOREIGN PATENT DOCUMENTS

| | | |
|---|---|---|
| JP | 2008-098664 A | 4/2008 |
| JP | 2008-308377 A | 12/2008 |
| WO | WO-2016/136552 A1 | 9/2016 |

OTHER PUBLICATIONS

International Searching Authority, "Written Opinion," issued in connection with International Patent Application No. PCT/JP2018/029720, dated Oct. 30, 2018.

* cited by examiner

NITRIDE SEMICONDUCTOR SUBSTRATE, LAMINATE, SUBSTRATE SELECTION PROGRAM, SUBSTRATE DATA OUTPUT PROGRAM, OFF-ANGLE COORDINATE MAP, AND METHODS THEREOF

CROSS-REFERENCE TO RELATED APPLICATIONS

The present application claims priority under 37 U.S.C. § 371 to International Patent Application No. PCT/JP2018/029720, filed Aug. 8, 2018, which claims priority to and the benefit of Japanese Patent Application No. 2017-208139, filed on Oct. 27, 2017. The contents of these applications are hereby incorporated by reference in their entireties.

TECHNICAL FIELD

The present invention relates to a nitride semiconductor substrate, a semiconductor laminate, a substrate selection program, a substrate data output program, a nitride semiconductor substrate provided with a substrate data output program, an off-angle coordinate map, a nitride semiconductor substrate provided with an off-angle coordinate map, a semiconductor device selection program, a nitride semiconductor substrate manufacturing method, a semiconductor laminate manufacturing method, a semiconductor device manufacturing method, and a substrate data output method.

DESCRIPTION OF RELATED ART

In a nitride semiconductor substrate including a group III nitride semiconductor crystal such as gallium nitride (GaN), an off-angle, which is an angle formed by a main axis of the crystal with respect to a normal of a main surface, may have a predetermined distribution within the main surface, due to a manufacturing method of the substrate (for example, see Patent Document 1).

PRIOR ART DOCUMENT

Patent Document

[Patent Document 1] Japanese Unexamined Patent Publication No. 2000-22212

SUMMARY OF THE INVENTION

Problem to be Solved by the Invention

An object of the present invention is to provide a technique to easily control a surface morphology of a semiconductor layer, which depends on an off-angle in a main surface of a nitride semiconductor substrate.

Means for Solving the Problem

According to an aspect of the present invention, there is provided
a nitride semiconductor substrate including a group III nitride semiconductor crystal and having a main surface,
wherein a low index crystal plane nearest to the main surface is (0001) plane curved in a concave spherical shape with respect to the main surface, and
the off-angle $(\theta_m, \theta_a)$ at a position (x, y) in the main surface is approximated by the following formula (1):

[Formula 1]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, $(M_1, A_1)$ represents a rate of change in the off-angle $(\theta_m, \theta_a)$ with respect to the position (x, y) in the main surface, and $(M_2, A_2)$ represents the off-angle $(\theta_m, \theta_a)$ at the center of the main surface, and a related technique.

Advantage of the Invention

According to the present invention, it is possible to easily control a surface morphology of a semiconductor layer, which depends on an off-angle in a main surface of a nitride semiconductor substrate.

BRIEF DESCRIPTION OF THE DRAWINGS

FIG. 1(c) is a schematic cross-sectional view along a-axis of the nitride semiconductor substrate according to an embodiment of the present invention.

DETAILED DESCRIPTION OF THE INVENTION

An Embodiment of the Present Invention

Hereinafter, an embodiment of the present invention will be described with reference to the drawings.

(1) Nitride Semiconductor Substrate (Nitride Semiconductor Free-Standing Substrate, Nitride Crystal Substrate)

Figure 1A:
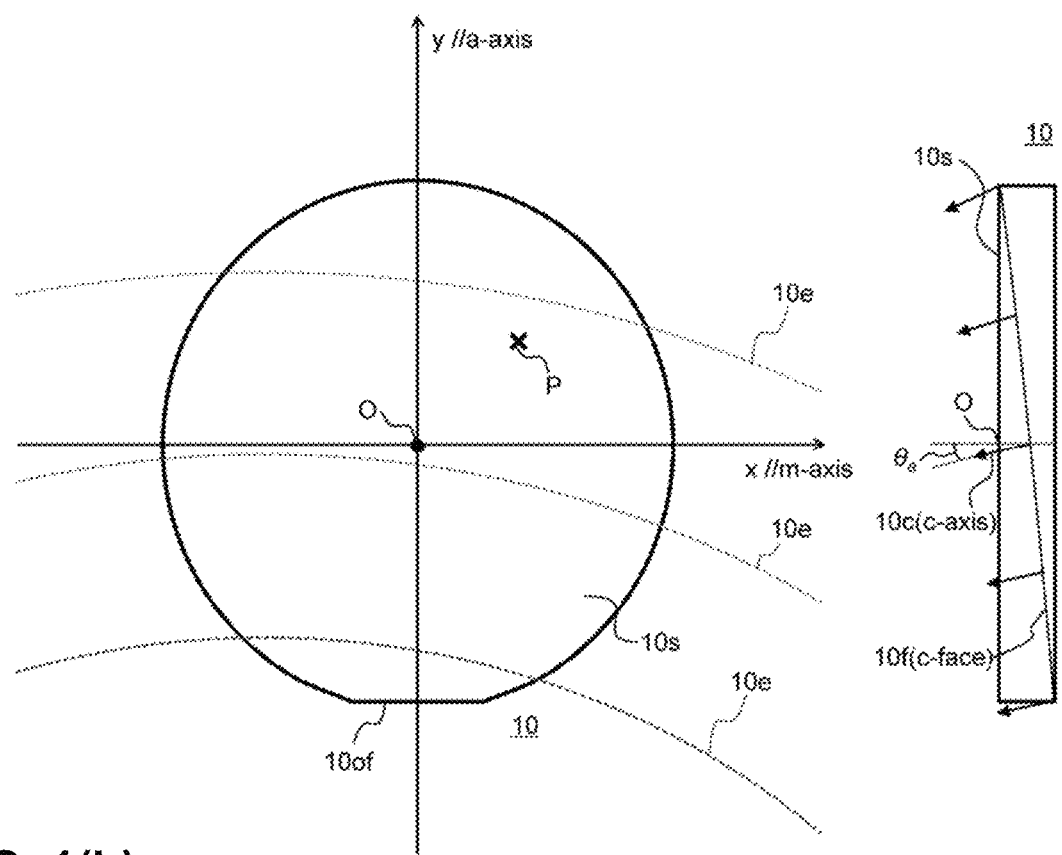
FIG. 1(a) is a schematic top view illustrating a nitride semiconductor substrate according to an embodiment of the present invention.
Figure 1B:
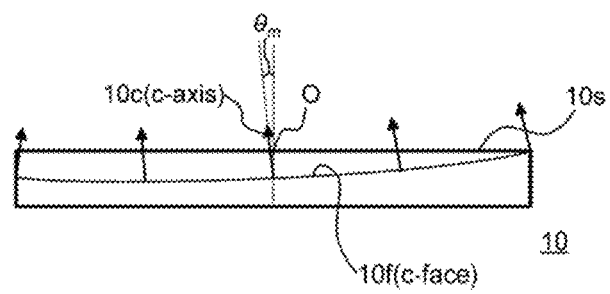
FIG. 1(b) is a schematic cross-sectional view along m-axis of the nitride semiconductor substrate according to an embodiment of the present invention.

First, a nitride semiconductor substrate 10 (sometimes abbreviated as a "substrate 10" hereafter) according to this embodiment will be described, with reference to FIG. 1. FIG. 1(a) is a schematic top view illustrating a nitride semiconductor substrate according to this embodiment, FIG. 1(b) is a schematic cross-sectional view along m-axis of the nitride semiconductor substrate according to this embodiment, and FIG. 1(c) is a schematic cross-sectional view along a-axis of the nitride semiconductor substrate according to this embodiment. The cross-section along m-axis and the cross-section along a-axis are cross-sections passing through a center of the main surface of the substrate, respectively.

The substrate 10 of this embodiment is constituted, for example, as a base substrate for epitaxially growing a semiconductor layer including a group III nitride semiconductor described later. The substrate 10 is a free-standing substrate including a group III nitride semiconductor crystal (single crystal). In this embodiment, the substrate 10 is, for example, a GaN free-standing substrate.

A diameter of the substrate 10 is, for example, 2 inches or more, and a thickness of the substrate 10 is, for example, 300 μm or more and 4 mm or less. Conductivity of the substrate 10 is not particularly limited. However, in the case of manufacturing a semiconductor device as a vertical Schottky barrier diode (SBD) using the substrate 10, the substrate 10 is, for example, n-type; n-type impurity in the substrate 10 is, for example, silicon (Si) or germanium (Ge); and the n-type impurity concentration in the substrate 10 is, for example, $1.0 \times 10^{18}$ cm$^{-3}$ or more and $1.0 \times 10^{19}$ cm$^{-3}$ or less.

Hereinafter, in a group III nitride semiconductor crystal having a wurtzite structure, <0001> axis (for example, [0001] axis) is referred to as "c-axis", and (0001) plane is referred to as "c-face". The (0001) plane is sometimes referred to as "+c-face (group III element polar face)", and (000-1) plane is sometimes referred to as "−c-face (nitrogen (N) polar face)". Further, <1-100> axis (for example, [1-100] axis) is referred to as "m-axis", and (1-100) plane is referred to as "m-face". Further, <11-20> axis (for example, [11-20] axis) is referred to as "a-axis", and (11-20) plane is referred to as "a-face".

The substrate 10 has, for example, a main surface (front surface) 10s which is to be an epitaxial growth surface. In this embodiment, the low index crystal plane nearest to the main surface 10s is, for example, a c-face 10f (+c-face). Surface roughness (arithmetic average roughness Ra) of the main surface 10s of the substrate 10 is, for example, 10 nm or less, preferably 5 nm or less.

Further, the substrate 10 has, for example, an orientation flat 10of (sometimes abbreviated as "Ori-fla 10of" hereinafter) as a flat surface constituting a part of a side surface (numeral not shown) connected to the main surface 10s and a back surface (numeral not shown). In this embodiment, the Ori-fla 10of is, for example, a-face. The Ori-fla 10of may be other than the a-face as long as it is perpendicular to the c-face.

Hereinafter, a direction parallel to the Ori-fla 10of among the directions along the main surface 10s of the substrate 10 is referred to as "x direction", and the coordinate in the direction parallel to the Ori-fla 10of at a position in the main surface 10s of the substrate 10 is referred to as "x". Meanwhile, a direction perpendicular to the Ori-fla 10of among the directions along the main surface 10s of the substrate 10 is referred to as "y direction", and the coordinate in the direction perpendicular to the Ori-fla 10of at a position in the main surface 10s of the substrate 10 is referred to as "y". The coordinate (x, y) of the center of the main surface 10s of the substrate 10 is (0, 0). In this embodiment, for example, the Ori-fla 10of is the a-face, and therefore the x direction is the direction along m-axis (approximately m-axis direction), and the y direction is the direction along a-axis (approximately a-axis direction).

In this embodiment, the c-face 10f as the low index crystal plane nearest to the main surface 10s of the substrate 10 is, for example, curved in a concave spherical shape with respect to the main surface 10s due to a manufacturing method of the substrate 10 described later. The term "spherical shape" as used herein means a curved surface shape which is approximated to a spherical surface. Further, the phrase "to be approximated to a spherical surface" used herein means to be approximated to a true spherical surface or an elliptical spherical surface within a predetermined error range.

In this embodiment, the c-face 10f of the substrate 10 is, for example, a curved surface shape that is approximated to a spherical surface in each of its cross-sections along m-axis and along a-axis.

In this embodiment, the radius of curvature of the c-face 10f is sufficiently larger than the radius of the substrate 10, for example, in each of cross-sections along m-axis and along a-axis. Specifically, the radius of curvature of the c-face 10f is, for example, 100 times or more the radius of the substrate 10. More specifically, the radius of curvature of the c-face 10f is, for example, 1 μm or more, preferably 4 μm or more, and more preferably 10 μm or more.

In this embodiment, the c-face 10f is curved in a concave spherical shape as described above, and therefore at least some of c-axes 10c is inclined with respect to the normal of the main surface 10s. The "off-angle" which is an angle formed by c-axis 10c with respect to the normal of the main surface 10s has a predetermined distribution within the main surface 10s.

Hereinafter, in the off-angle of c-axis 10c with respect to the normal of the main surface 10s, a directional component along m-axis is referred to as "$\theta_m$", and is sometimes abbreviated as "off-angle m-axis component $\theta_m$". Further, in the off-angle of c-axis 10c with respect to the normal of the main surface 10s, a directional component along a-axis is referred to as "$\theta_a$", and is sometimes abbreviated as "off-angle a-axis component $\theta_a$". When c-axis 10c is inclined, m-axis and a-axis are also inclined. Therefore the directional component along m-axis and the directional component along a-axis, can be strictly called in other words as the directional component obtained by orthogonally projecting m-axis onto the main surface 10s and the directional component obtained by orthogonally projecting a-axis on the main surface 10s, respectively. Further, in the following description, the off-angle is represented as ($\theta_m$, $\theta_a$) as a vector, and a size of the off-angle (off amount) is represented as "$\theta$". Incidentally, $\theta^2 = \theta_m^2 + \theta_a^2$.

As illustrated in FIG. 1, in the main surface 10s of the substrate 10, a line of equal off-angle size θ (equal off-angle line 10e) is approximately arc shape. At the center of the equal off-angle line 10e in the main surface 10s of the substrate 10, the off-angle size θ is 0°. Moreover, in the main surface 10s of the substrate 10, the further the equal off-angle line 10e is from its center, the larger the off-angle size θ of the equal off-angle line 10e is.

Figure 2:
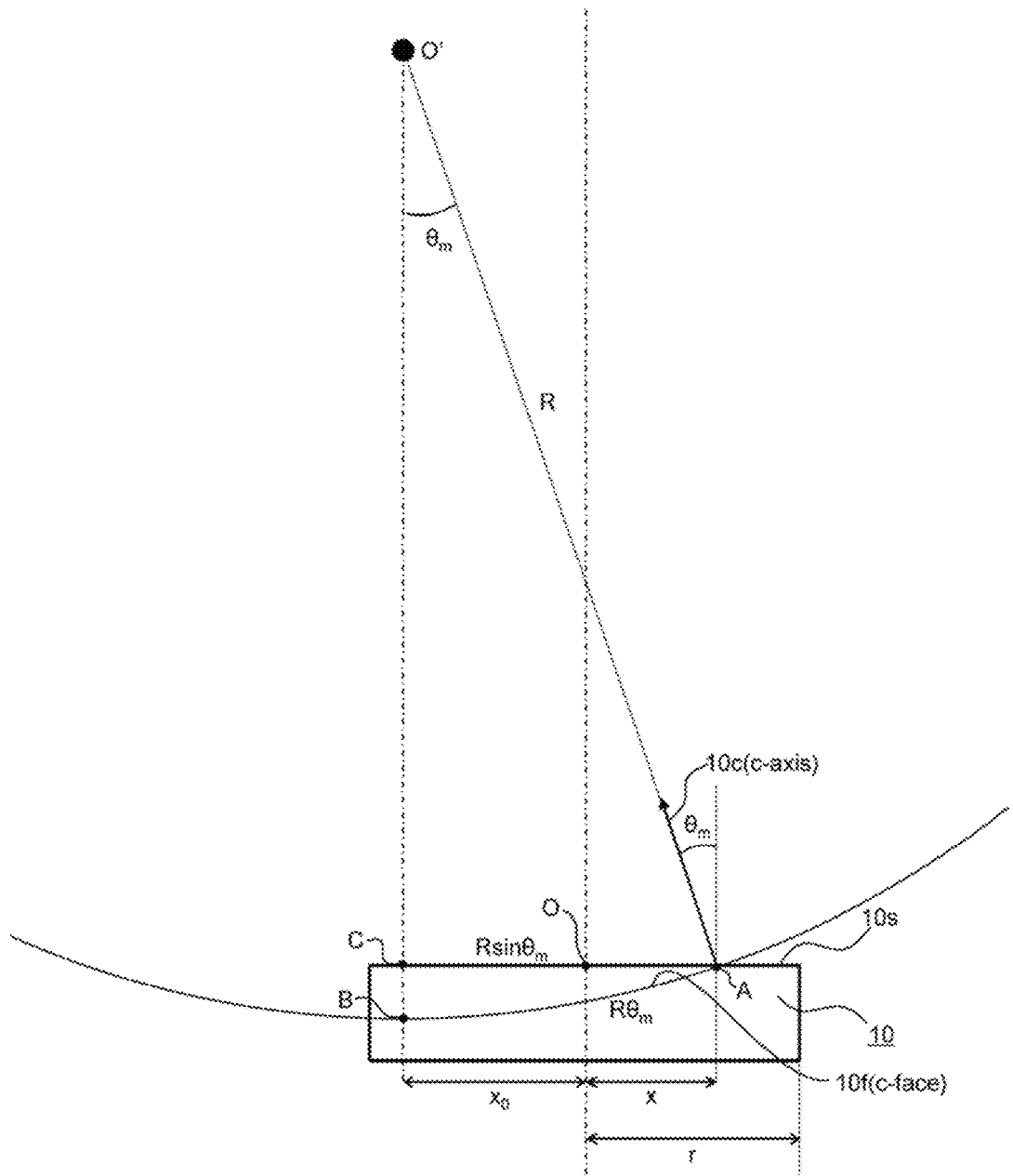
FIG. 2 is a schematic cross-sectional view along m-axis of the nitride semiconductor substrate according to an embodiment of the present invention.

Now, an off-angle m-axis component $\theta_m$ in a cross-section along m-axis of the substrate 10 of this embodiment will be described with reference to FIG. 2. FIG. 2 is a schematic cross-sectional view along m-axis of the nitride semiconductor substrate according to this embodiment.

As illustrated in FIG. 2, in the cross-section along m-axis, the center of curvature of the c-face 10f is referred to as "O'", a predetermined point on the main surface 10s is referred to as a point "A", an intersection of a normal of the main surface 10s passing through the center of curvature O' and the c-face 10f is referred to as a point "B", and an intersection of a normal of the main surface 10s passing through the center of curvature O' and the main surface 10s is referred to as a point "C". In addition, a radius of curvature of the c-face 10f in the cross-section along m-axis is referred to as "R" and a diameter of the substrate 10 is referred to as "r". Moreover, a distance between the center O of the main surface 10s and the point A is referred to as "x", and a distance between the center O of the main surface 10s and the point C (i.e., the amount of deviation between the center O of the main surface 10s and the center of curvature O' in the x direction) is referred to as "$x_0$".

Since the normal of the main surface 10s passing through the point A is parallel to the normal of the main surface 10s passing through the center of curvature O' and the point C, the angle AOC is equal to the off-angle m-axis component $\theta_m$ at the point A. Therefore, the distance between A and C can be determined by the following formula using $\theta_m$:

$$x + x_0 = R \sin \theta_m.$$

In this embodiment, as described above, since the radius of curvature R of the c-face 10f is sufficiently larger than the radius r of the substrate 10, the off-angle (off-angle m-axis component $\theta_m$) of c-axis 10c with respect to the normal of the main surface 10s is sufficiently small. Since the off-angle is sufficiently small, the following approximation can hold: $\sin \theta_m \approx \theta_m$. Thereby, the distance between A and C, $R \sin \theta_m$, can be approximated by the distance between A and B on the arc, $R\theta_m$.

Therefore, the above formula can be approximated by the following formula:

$$x + x_0 = R\theta_m.$$

This formula is transformed into a formula for $\theta_m$ as follows:

$$\theta_m = x/R + x_0/R$$

According to the above formula, at an arbitrary point on the main surface 10s in the cross-section along m-axis of the substrate 10 of this embodiment, the off-angle m-axis component $\theta_m$ can be approximately represented by the linear formula of x. That is, in a cross-section along m-axis of the substrate 10, $\theta_m$ can be considered to vary in a substantially linear manner with respect to x (varying in proportion to x).

In this embodiment, as described above, the c-face 10f of the substrate 10 is a curved surface shape that is approximated to a spherical surface, in a cross-section along a-axis as well. Accordingly, at an arbitrary point on the main surface 10s in the cross-section along a-axis of the substrate 10 of this embodiment, the off-angle a-axis component $\theta_a$ can be approximately represented by the linear formula of y. That is, in a cross-section along a-axis of the substrate 10, $\theta_a$ can be considered to vary in a substantially linear manner with respect to y (varying in proportion to y).

As described above, the off-angle ($\theta_m$, $\theta_a$) at an arbitrary position (x, y) in the main surface 10s of the substrate 10 is approximately represented by the following formula using a matrix (matrix equation) (1):

[Formula 2]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

wherein ($M_1$, $A_1$) (in °/mm) is a rate of change (slope, proportionality constant) in the off-angle ($\theta_m$, $\theta_a$) with respect to the position (x, y) (distances in the x direction and in the y direction, respectively, in mm) in the main surface 10s, and ($M_2$, $A_2$) (in °) is the off-angle ($\theta_m$, $\theta_a$) at the center O of the main surface 10s.

The off-angle ($\theta_m$, $\theta_a$) at an arbitrary position (x, y) in the main surface 10s of the substrate 10 is approximately represented by the following formula (1)':

[Formula 3]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} \cos\gamma & -\sin\gamma & 0 \\ \sin\gamma & \cos\gamma & 0 \\ 0 & 0 & 1 \end{pmatrix} \begin{pmatrix} x \\ y \\ 1 \end{pmatrix} \quad (1)'$$

wherein the Ori-fla 10of is an arbitrary face perpendicular to the c-face, and γ represents an angle of the Ori-fla 10of with respect to the a-face.

Hereafter, the description relating to the formula (1) can apply to the formula (1)'.

In each of the formulas (1) and (1)', $M_1$ and $A_1$ correspond to the reciprocal of the radius of curvature of the c-face 10f in the direction along m-axis and the reciprocal of the radius of curvature of the c-face 10f in the direction along a-axis, respectively, where the unit of $M_1$ and the like is required to be converted from ° to radian.

The off-angle $(\theta_m, \theta_a)$ at an arbitrary position (x, y) in the main surface 10s of the substrate 10 is approximately represented by the aforementioned formula (1), so that the off-angle $(\theta_m, \theta_a)$ at the arbitrary position (x, y) in the main surface of the substrate can be immediately obtained.

The off-angle $(\theta_m, \theta_a)$ at an arbitrary position (x, y) in the main surface 10s of the substrate 10 is approximately represented by the aforementioned formula (1), so that a range (outline) of the main surface 10s of the substrate 10 can be displayed on the off-angle coordinate map (off-angle coordinate map information) 20 which is an orthogonal coordinate system wherein the off-angle m-axis component $\theta_m$ and the off-angle a-axis component $\theta_a$ are coordinate axes.

Figure 3:
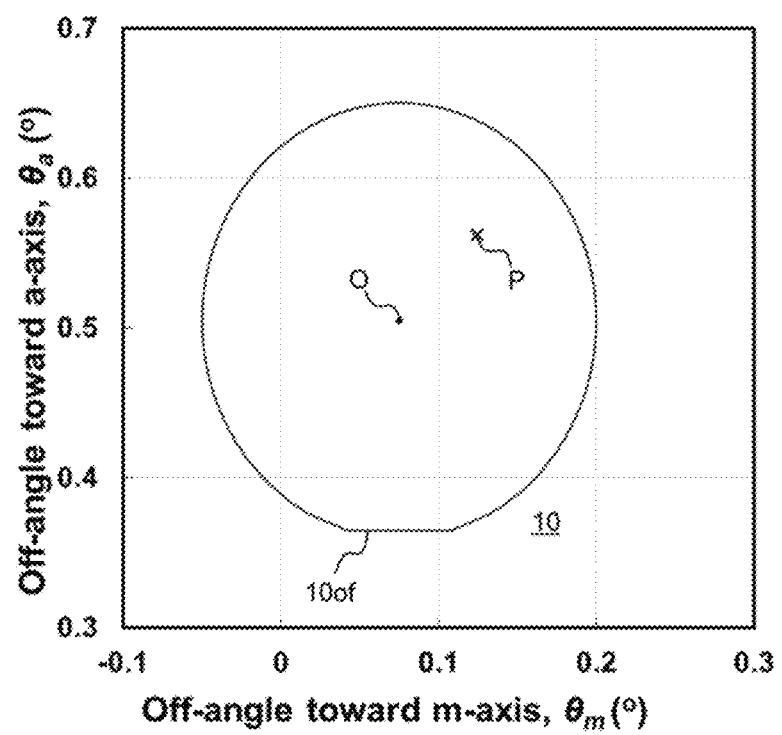
FIG. 3 is an off-angle coordinate map illustrating a range of the main surface of the nitride semiconductor substrate according to an embodiment of the present invention.

Now, with reference to FIG. 3, an off-angle coordinate map 20 wherein the off-angle m-axis component $\theta_m$ and the off-angle a-axis component $\theta_a$ are coordinate axes will be described. FIG. 3 is an off-angle coordinate map illustrating a range of the main surface of the nitride semiconductor substrate according to this embodiment.

In the off-angle coordinate map 20 illustrated in FIG. 3, when an off-angle $(\theta_m, \theta_a)$ (e.g., expressed in °) at a position (x, y) (e.g., expressed in mm) of an outer edge of the main surface 10s of the substrate 10 is plotted, an approximately circular shape corresponding to a circular shape of the main surface 10s of the actual substrate 10 can be drawn in the off-angle coordinate map 20 as well. That is, the range of the main surface 10s of the substrate 10 can be displayed on the off-angle coordinate map 20 in correspondence with the range of the main surface 10s of the actual substrate 10.

In the range of the main surface 10s of the substrate 10 on the off-angle coordinate map 20, the diameter in the $\theta_m$-axis direction is $2|M_1|_r$, and the diameter in the $\theta_a$-axis direction is $2|A_1|_r$. The range of the main surface 10s of the substrate 10 on the off-angle coordinate map 20 is an ellipse as long as $|M_1| \neq |A_1|$.

For example, an arbitrary point P other than the center O in the main surface 10s of the actual substrate 10 illustrated in FIG. 1(a) will be discussed.

In this embodiment, as described above, the off-angle $(\theta_m, \theta_a)$ at an arbitrary position (x, y) in the main surface 10s of the substrate 10 is approximately represented by the aforementioned formula (1). That is, the off-angle $(\theta_m, \theta_a)$ varies in a substantially linear manner with respect to (x, y). Thus, the positional relation of the point P relative to the center O of the actual substrate (the substrate in a real space) 10 in FIG. 1(a) can be associated with the positional relation of the point P relative to the center O of the substrate 10 on the off-angle coordinate map 20 illustrated in FIG. 3. The positional relation of the point P relative to the center O of the substrate 10 is associated in this way, so that the off-angle $(\theta_m, \theta_a)$ at the point P can be read from the coordinate value at the point P in the off-angle coordinate map 20. Specifically, based on the positional relation of the point P relative to the center O of the actual substrate 10 in the FIG. 1, the point P is plotted in the off-angle coordinate map 20 of FIG. 3, so that the off-angle $(\theta_m, \theta_a)$ at the point P can be read, for example, as (0.12, 0.56) from the coordinate value at the point P.

When the Ori-fla 10of is a face other than the a-face, the positional relation of the point P relative to the center O of the main surface 10s of the actual substrate 10 is rotated by γ, which is an angle of Ori-fla 10of relative to the a-face, so that it may be associated with the positional relation of the point P relative to the center O in the range of the main surface 10s of the substrate 10 on the off-angle coordinate map 20.

As described above, in the off-angle coordinate map 20, the range of the main surface 10s of the substrate 10 is displayed, so that the off-angle distribution of the main surface 10s of the substrate 10 can be easily grasped. For example, in the off-angle coordinate map 20, when the range of the main surface 10s of the substrate 10 is large, it can be grasped that the off-angle distribution of the main surface 10s of the substrate 10 is wide. On the other hand, when the range of the main surface 10s of the substrate 10 is small, it can be grasped that the off-angle distribution of the main surface 10s of the substrate 10 is narrow.

Further, in the off-angle coordinate map 20, the range of the main surface 10s of the substrate 10 is displayed, so that it is possible to easily grasp the surface morphology distribution of the semiconductor layer in a range of the main surface 10s of the substrate 10, so as to correspond to the dependence of the surface morphology of the semiconductor layer, grown on the main surface 10s of the substrate 10, on the off-angle of the main surface 10s of the substrate 10.

Figure 4:
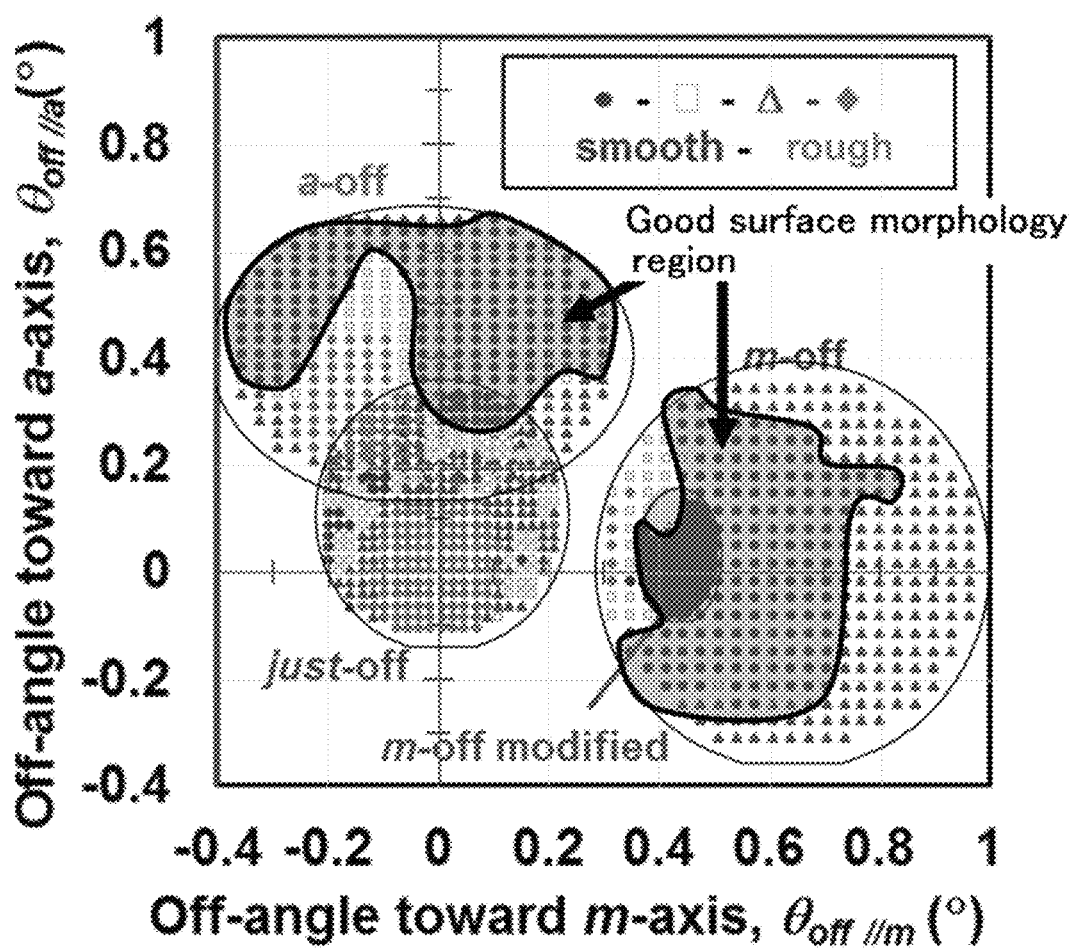
FIG. 4 is an off-angle coordinate map illustrating a good surface morphology region.

Here, the dependence of the surface morphology of the semiconductor layer on the off-angle of the main surface 10s of the substrate 10 will be described with reference to FIG. 4. FIG. 4 is an off-angle coordinate map illustrating a good surface morphology region.

In order to evaluate the dependence of the surface morphology of the semiconductor layer on the off-angle of the main surface of the substrate, a semiconductor laminate (epitaxial wafer) constituting SBD is fabricated. The semiconductor laminate has a laminate structure including a substrate and a semiconductor layer. The substrate is an n-type GaN free-standing substrate having a diameter of 2 inches and a thickness of 400 μm. Further, a base n-type semiconductor layer and a drift layer are sequentially formed as semiconductor layers. The base n-type semiconductor layer is a Si-doped GaN layer, Si concentration in the base n-type semiconductor layer is $2 \times 10^{18}$ cm$^{-3}$, and the thickness of the base n-type semiconductor layer is 2 μm. Further, the drift layer is a Si-doped GaN layer, Si concentration in the drift layer is $0.9 \times 10^{16}$ cm$^{-3}$, and the thickness of the drift layer is 13 μm.

In the off-angle coordinate map of FIG. 4, the range of the main surface is illustrated for each of the four substrates used for fabricating the semiconductor laminate. The four substrates have mutually different off-angle distributions. Among the four substrates, a substrate whose off-angle at the center of the main surface is close to (0, 0) is referred to as a "just-off substrate". Further, a substrate whose off-angle at the center of the main surface is away from (0, 0) and close to the $\theta_m$-axis is referred to as a "m-off substrate" or a "m-off improved substrate". The off-angle distribution of the m-off improved substrate is narrower than the off-angle distribution of the m-off substrate. Further, a substrate whose off-angle at the center of the main surface is away from (0, 0) and close to the $\theta_a$-axis is referred to as an "a-off substrate". The Ori-fla of each of the four substrates is the a-face.

Further, the off-angle coordinate map of FIG. 4 indicates a result of visually evaluating the surface morphology of the semiconductor layer every 2.25 mm square in a semiconductor laminate in which each of four substrates is used, and indicates that the surface morphology of the semiconductor layer is good in an ascending order of: black diamonds, open triangles, open squares, and black circles.

As a trend of the observation result, stripe-shaped step bunching in the direction along m-axis is observed, on the whole surface of 2.25 square field of view in the portion including the black diamonds. This is remarkably observed when the off-angle ($\theta_m$, $\theta_a$) of the just-off substrate is close to (0, 0) as described later. Further, in the portion of the open triangles and the portion of the open squares, in this order, the proportion of the step bunching in the 2.25 mm square field of view is gradually decreased. Further, in the portion of the black circles, it is a flat surface on almost the whole surface of the 2.25 mm square field of view.

As measured by an atomic force microscope (AFM), it is found that the portion of the black diamonds corresponds to a surface roughness (arithmetic average roughness Ra) of 70 nm or more, and the portion of the open triangles corresponds to the surface roughness of 30 nm or more and 70 nm or less, and the portion of the open squares corresponds to a surface roughness of 10 nm or more and 30 nm or less, and the portion of the black circles corresponds to a surface roughness of 10 nm or less. It is also confirmed that the surface morphology distribution result similar to the visual evaluation result obtained by the Nomarski microscope can also be obtained through the surface morphology measurement by measuring a scattered light distribution when the surface of the semiconductor layer is irradiated with laser light.

As illustrated in FIG. 4, the surface morphology of the semiconductor layer depends on the off-angle of the main surface of the substrate. When the off-angle ($\theta_m$, $\theta_a$) is close to (0, 0), the surface morphology of the semiconductor layer tends to be rough. In the case that the semiconductor device as an SBD is fabricated from a portion where the off-angle ($\theta_m$, $\theta_a$) is (0, 0) in the main surface of the substrate, there is a possibility that a withstand voltage of the SBD is lowered. In contrast, in a region (a region surrounded by a thick line) where the off-angle ($\theta_m$, $\theta_a$) is separated from (0, 0) by a predetermined distance, the surface morphology of the semiconductor layer is good. Hereinafter, in the off-angle coordinate map 20, a region where the surface morphology of the semiconductor layer is good is called a "good surface morphology region". Since the semiconductor device as an SBD is fabricated from the portion where the off-angle ($\theta_m$, $\theta_a$) is within a good surface morphology region in the main surface of the substrate, the withstand voltage of the SBD can be improved.

Further, as illustrated in FIG. 4, it is possible to easily grasp the surface morphology distribution of the semiconductor layer in a range of the main surface of the substrate, so as to correspond to the dependence of the surface morphology of the semiconductor layer, on the off-angle of the main surface of the substrate. For example, it is found that on the just-off substrate, a good surface morphology region can be obtained only in a part close to an outer edge of the range of the main surface. That is, in the case that the semiconductor device is manufactured using the just-off substrate, it is expected that the yield of the semiconductor device will be lowered. Meanwhile, for example, in the m-off improved substrate, it is found that the range of the main surface on the off-angle coordinate map 20, that is, the off-angle distribution is narrow, and most of the range is included in the good surface morphology region. That is, in the case of manufacturing the semiconductor device using the m-off improved substrate, it is possible to improve the yield of the semiconductor device.

Figure 5:
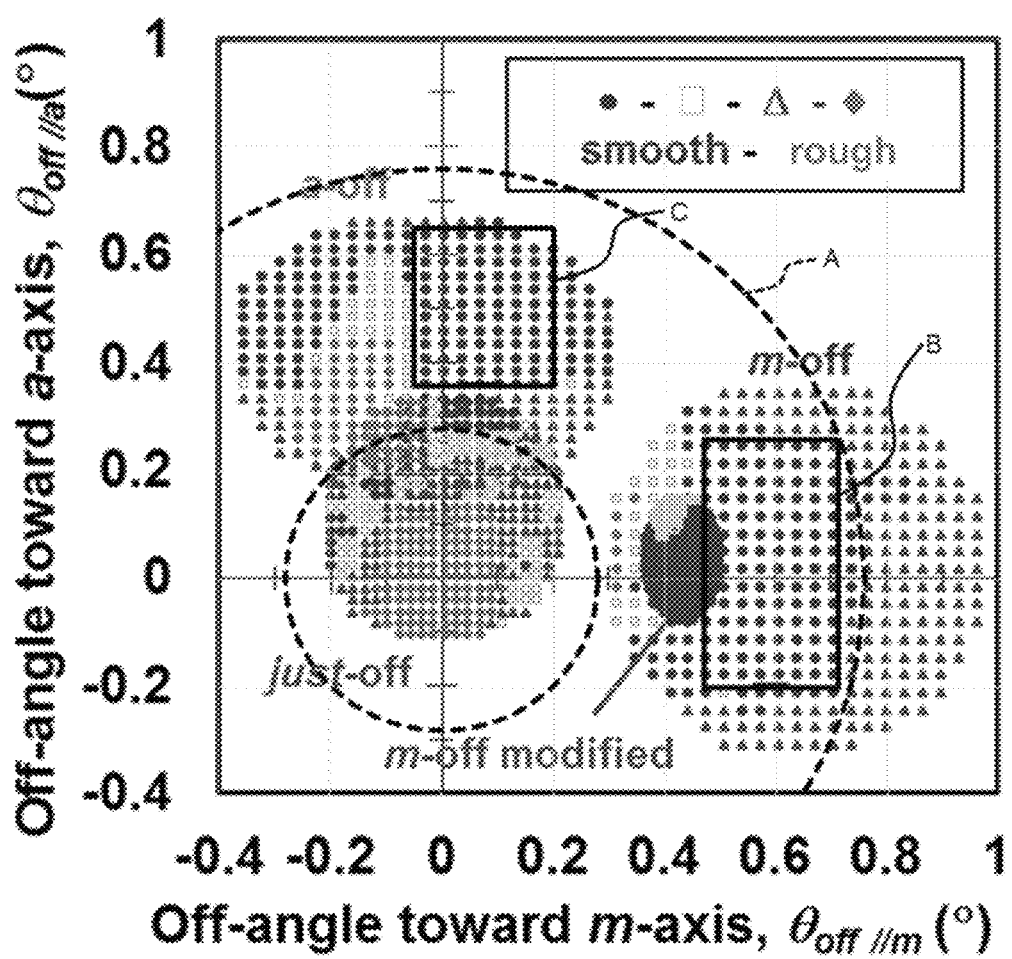
FIG. 5 is an off-angle coordinate map illustrating regions A, B, and C.

Next, classification of the good surface morphology region will be described with reference to FIG. 5. FIG. 5 is an off-angle coordinate map illustrating regions A, B, and C.

As illustrated in FIG. 5, for example, the good surface morphology regions are classified into three regions (A, B, C) that can be represented by inequalities of the off-angle ($\theta_m$, $\theta_a$).

Region A shows a concentric circle region (donut-shaped region) in which the off-angle size θ is within a predetermined range, including at least a part of the good surface morphology region. Specifically, region A is represented by the following formula, for example:

$0.28 \leq \theta \leq 0.76$ that is, $$0.0784 \leq \theta_m^2 + \theta_a^2 \leq 0.578 \quad (2)$$

Region B represents a region that is away from (0, 0), close to the $\theta_m$-axis, and entirely included in the good surface morphology region. That is, region B can be considered as a good surface morphology region on the m-off side. Specifically, region B is represented by, for example, the following formulas (3-1) and (3-2):

$$0.47 \leq \theta_m \leq 0.71 \quad (3-1)$$

$$-0.20 \leq \theta_a \leq 0.26 \quad (3-2)$$

Region C represents a region that is away from (0, 0), close to the a-axis, and entirely included in the good surface morphology region. That is, region C can be considered as a good surface morphology region on the a-off side. Specifically, region C is represented by, for example, the following formulas (4-1) and (4-2):

$$-0.05 \leq \theta_m \leq 0.21 \quad (4-1)$$

$$0.36 \leq \theta_a \leq 0.65 \quad (4-2)$$

Figure 6:
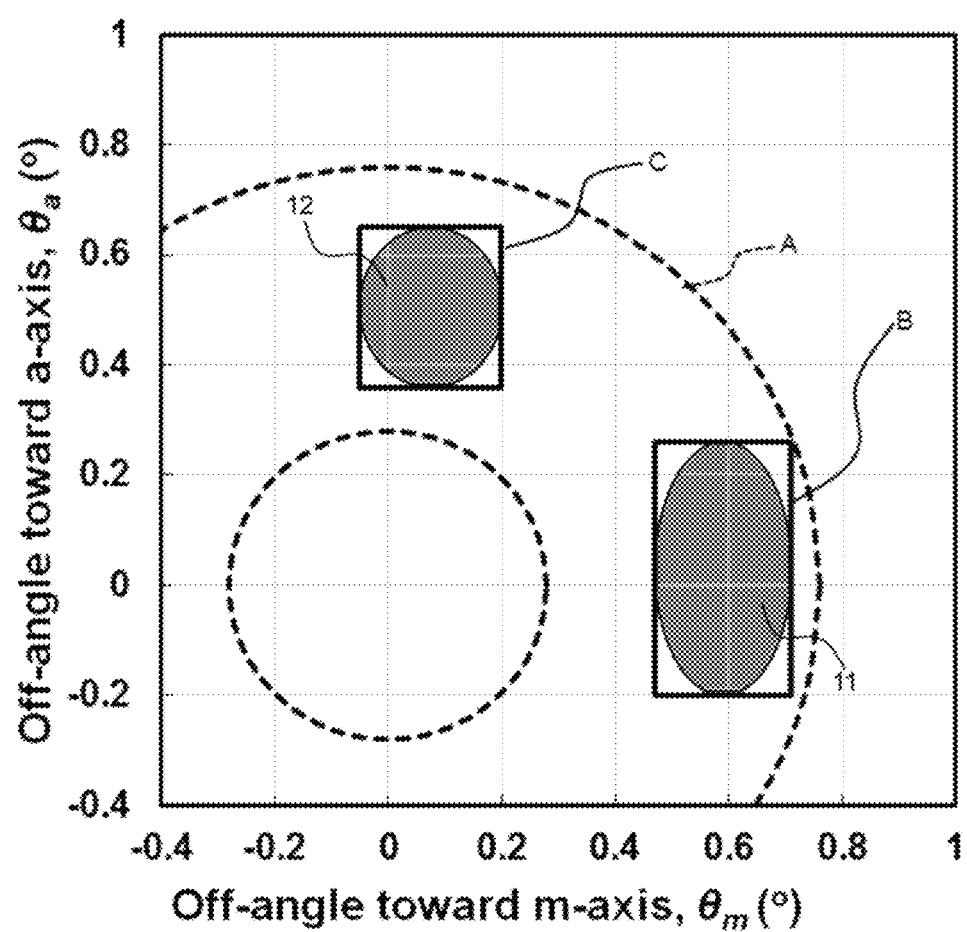
FIG. 6 is an off-angle coordinate map illustrating a relation between the range of the main surface of the nitride semiconductor substrate according to an embodiment of the present invention and the regions A, B, and C.

Next, with reference to FIG. 6, the relation between the range of the main surface 10s of the substrate 10 of this embodiment and the good surface morphology region will be described. FIG. 6 is an off-angle coordinate map illustrating a relation between the range of the main surface of the nitride semiconductor substrate according to an embodiment of the present invention and the regions A, B, and C. In FIG. 6, as an ideal specific example of the substrate 10 of this embodiment, a first example is represented by "substrate 11" and a second example is represented by "substrate 12".

The main surface 10s of the substrate 10 of this embodiment does not include, for example, a region where the off-angle ($\theta_m$, $\theta_a$) is (0,0). When the off-angle ($\theta_m$, $\theta_a$) of the main surface 10s of the substrate 10 is close to (0, 0), the surface morphology of the semiconductor layer tends to be rough, as described above. Therefore, since the main surface 10s of the substrate 10 is constituted to avoid this region, roughening of the surface morphology of the semiconductor layer can be suppressed.

The off-angle ($\theta_m$, $\theta_a$) at least at a part of the main surface 10s of the substrate 10 of this embodiment is, for example, included in region A and satisfies the above formula (2). Thereby, it is possible to obtain a portion where the surface morphology of the semiconductor layer is good, from at least a part of the semiconductor laminate in which the substrate 10 is used.

Further, the off-angle ($\theta_m$, $\theta_a$) at least at the center O of the main surface 10s of the substrate 10 of this embodiment, that is, ($M_2$, $A_2$) is, for example, included in region A and satisfies the above formula (2). Thereby, it is possible to widen a portion in which the off-angle ($\theta_m$, $\theta_a$) is included in region A in the main surface 10s of the substrate 10. As a result, it is possible to obtain many portions where the surface morphology of the semiconductor layer is good, from the semiconductor laminate in which the substrate 10 is used.

Further, the proportion of the area of the region where the off-angle ($\theta_m$, $\theta_a$) satisfies the formula (2), with respect to a total area of the main surface 10s of the substrate 10 of this embodiment is, for example, more than 50%, preferably 80% or more. Thereby, it is possible to stably obtain a portion where the surface morphology of the semiconductor layer is good, from the semiconductor laminate in which the substrate 10 is used. As a result, it is possible to improve the yield of the semiconductor device.

The off-angle ($\theta_m$, $\theta_a$) at least at a part of the main surface 10s of the substrate 10 of this embodiment is for example included in region B and satisfies the above formulas (3-1) and (3-2). Thereby, it is possible to obtain a portion where the surface morphology of the semiconductor layer is good, from at least a part of the semiconductor laminate in which the substrate 10 is used.

Further, the off-angle ($\theta_m$, $\theta_a$) at least at the center O of the main surface 10s of the substrate 10 of this embodiment, that is, ($M_2$, $A_2$) is, for example, included in region B and satisfies the above formulas (3-1) and (3-2). Thereby, it is possible to widen a portion where the off-angle ($\theta_m$, $\theta_a$) is included in region B in the main surface 10s of the substrate 10. As a result, it is possible to obtain many portions where the surface morphology of the semiconductor layer is good, from the semiconductor laminate in which the substrate 10 is used.

Further, the proportion of the area of the region where the off-angle ($\theta_m$, $\theta_a$) satisfies the above formulas (3-1) and (3-2), with respect to the total area of the main surface 10s of the substrate 10 of this embodiment is, for example, more than 50%, preferably 80% or more. Thereby, it is possible to stably obtain a portion where the surface morphology of the semiconductor layer is good, from the semiconductor laminate in which the substrate 10 is used. As a result, it is possible to improve the yield of the semiconductor device.

In the substrate 11 as an ideal first example, for example, the entire range of the main surface 10s is included in region B in the off-angle coordinate map 20. The proportion of the area of the region where the off-angle ($\theta_m$, $\theta_a$) satisfies the formulas (3-1) and (3-2), with respect to the total area of the main surface 10s of the substrate 11 is, for example, 100%. Thereby, it is possible to reliably obtain a portion where the surface morphology of the semiconductor layer is good, from the entire semiconductor laminate in which the substrate 10 is used.

Alternatively, the off-angle ($\theta_m$, $\theta_a$) at least at a part of the main surface 10s of the substrate 10 of this embodiment is, for example, included in region C and satisfies the above formulas (4-1) and (4-2). Thereby, it is possible to obtain a portion where the surface morphology of the semiconductor layer is good, from at least a part of the semiconductor laminate in which the substrate 10 is used.

Further, the off-angle ($\theta_m$, $\theta_a$) at least at the center O of the main surface 10s of the substrate 10 of this embodiment, that is, ($M_2$, $A_2$) is, for example, included in region C and satisfies the above formulas (4-1) and (4-2). Thereby, it is possible to widen a portion where the off-angle ($\theta_m$, $\theta_a$) is included in region C in the main surface 10s of the substrate 10. As a result, it is possible to obtain many portions where the surface morphology of the semiconductor layer is good, from the semiconductor laminate in which the substrate 10 is used.

Further, the proportion of the area of the region where the off-angle ($\theta_m$, $\theta_a$) satisfies the above formulas (4-1) and (4-2), with respect to the total area of the main surface 10s of the substrate 10 of this embodiment is, for example, more than 50%, preferably 80% or more. Thereby, it is possible to stably obtain a portion where the surface morphology of the semiconductor layer is good, from the semiconductor laminate in which the substrate 10 is used. As a result, it is possible to improve the yield of the semiconductor device.

In the substrate 12 as an ideal second example, for example, the entire range of the main surface 10s is included in region C in the off-angle coordinate map 20. The proportion of the area of the region where the off-angle ($\theta_m$, $\theta_a$) satisfies the formulas (4-1) and (4-2), with respect to the total area of the main surface 10s of the substrate 12 is, for example, 100%. Thereby, it is possible to reliably obtain a portion where the surface morphology of the semiconductor layer is good, from the entire semiconductor laminate in which the substrate 10 is used.

Further, in the substrate 10 of this embodiment, an absolute value of a rate of change in the off-angle m-axis component $\theta_m$, $|M_1|$, is different, for example, from an absolute value of a rate of change in the off-angle a-axis component $\theta_a$, $|A_1|$. This corresponds to that the radius of curvature of the c-face 10f in the direction along m-axis is different from the radius of curvature of the c-face 10f in the direction along a-axis in the substrate 10. Thereby, the range of the main surface 10s of the substrate 10 can be easily adjusted so as to correspond to a complicated distribution of the good surface morphology region in the off-angle coordinate map 20. As a result, the portion where the surface morphology of the semiconductor layer is good can be widened efficiently in the main surface 10s of the substrate 10.

Furthermore, in the substrate 10 of this embodiment, the absolute value of the rate of change in the off-angle m-axis component $\theta_m$, $|M_1|$, is smaller than, for example, the absolute value of the rate of change of the off-angle a-axis component $\theta_a$, $|A_1|$. This corresponds to that the radius of curvature of the c-face 10f in the direction along m-axis is larger than the radius of curvature of the c-face 10f in the direction along a-axis in the substrate 10. Here, in the good surface morphology region of the off-angle coordinate map 20 described above, there are many regions that are short in the $\theta_m$-axis direction and long in the $\theta_a$-axis direction. Therefore, in this embodiment, since $|M_1|<|A_1|$, the range of the main surface 10s of the substrate 10 can be easily adjusted so as to correspond to the region that is short in the $\theta_m$-axis direction and long in the $\theta_a$-axis direction in the good surface morphology region in the off-angle coordinate map 20. As a result, the portion where the surface morphology of the semiconductor layer is good can be widened more efficiently in the main surface 10s of the substrate 10.

Moreover, in this embodiment, an error of the off-angle actually measured with respect to the off-angle obtained by the formula (1), $\Delta\theta$ (hereinafter referred to as "off-angle error"), at arbitrary position in the main surface 10s of the substrate 10 is within ±0.12°, preferably within ±0.06°. When the off-angle error $\Delta\theta$ is more than ±0.12°, the range of the main surface 10s of the substrate 10 based on the off-angle actually measured is wider than the range of the main surface 10s of the substrate 10 obtained by the formula (1) in the off-angle coordinate map 20. Therefore, the off-angle ($\theta_m$, $\theta_a$) in at least a part of the main surface 10s of the actual substrate 10 may deviate from the aforementioned region A, B, or C. In contrast, in this embodiment, since the off-angle error $\Delta\theta$ is within ±0.12°, it is possible to suppress the range of the main surface 10s of the substrate 10 based on the off-angle actually measured from being excessively wider than the range of the main surface 10s of the substrate 10 obtained by the formula (1) in the off-angle coordinate map 20. Thereby, it is possible to suppress the off-angle ($\theta_m$, $\theta_a$) in at least a part of the main surface 10s of the actual substrate 10 from deviating from the aforementioned region A, B, or C. In addition, in this embodiment, since the off-angle error Δθ is within ±0.06°, it is possible to make the range of the main surface 10s of the substrate 10 based on the off-angle actually measured approximate the range of the main surface 10s of the substrate 10 obtained by the formula (1) in the off-angle coordinate map 20. Thereby, in the main surface 10s of the actual substrate 10, it is possible to stably widen a portion, where the off-angle ($\theta_m$, $\theta_a$) is included in the aforementioned region A, B, or C.

Further, in this embodiment, the off-angle error Δθ of the substrate 10 has an off-direction dependence, for example, due to the manufacturing method described later.

Specifically, in this embodiment, for example, when the off-angle m-axis component $\theta_m$ is larger than the off-angle a-axis component $\theta_a$ at the center of the main surface 10s of the substrate 10, a maximum absolute value of an error of the off-angle m-axis component $\theta_m$ actually measured with respect to the off-angle m-axis component $\theta_m$ obtained by the formula (1) (hereinafter referred to as a "$\theta_m$ maximum error") is smaller than a maximum absolute value of an error of the off-angle a-axis component $\theta_a$ actually measured with respect to the off-angle a-axis component $\theta_a$ obtained by the formula (1) (hereinafter referred to as a "$\theta_a$ maximum error"). Specifically, in the substrate 10 of this embodiment, for example, the $\theta_m$ maximum error is 0.06°, whereas the $\theta_a$ maximum error is 0.12°. Thereby, in the off-angle coordinate map 20, the span of the range of the main surface 10s of the substrate 10 based on the off-angle actually measured, with respect to the range of the main surface 10s of the substrate 10 obtained by the formula (1), can be short in the $\theta_m$-axis direction. As a result, in the off-angle coordinate map 20, the accuracy of adjustment in the $\theta_m$-axis direction can be improved, for example, when adjusting the range of the main surface 10s of the substrate 10 based on the off-angle actually measured so as to correspond to region B.

Alternatively, in this embodiment, for example, when the off-angle a-axis component $\theta_a$ is larger than the off-angle m-axis component $\theta_m$ at the center of the main surface 10s of the substrate 10, the $\theta_a$ maximum error is smaller than the $\theta_m$ maximum error. Thereby, in the off-angle coordinate map 20, the span of the range of the main surface 10s of the substrate 10 based on the off-angle actually measured, with respect to the range of the main surface 10s of the substrate 10 obtained by the formula (1), can be short in the $\theta_a$-axis direction. As a result, in the off-angle coordinate map 20, the accuracy of adjustment in the $\theta_a$-axis direction can be improved, for example, when adjusting the range of the main surface 10s of the substrate 10 based on the off-angle actually measured so as to correspond to region C.

(2) Various Programs and Off-Angle Coordinate Map

Figure 7:
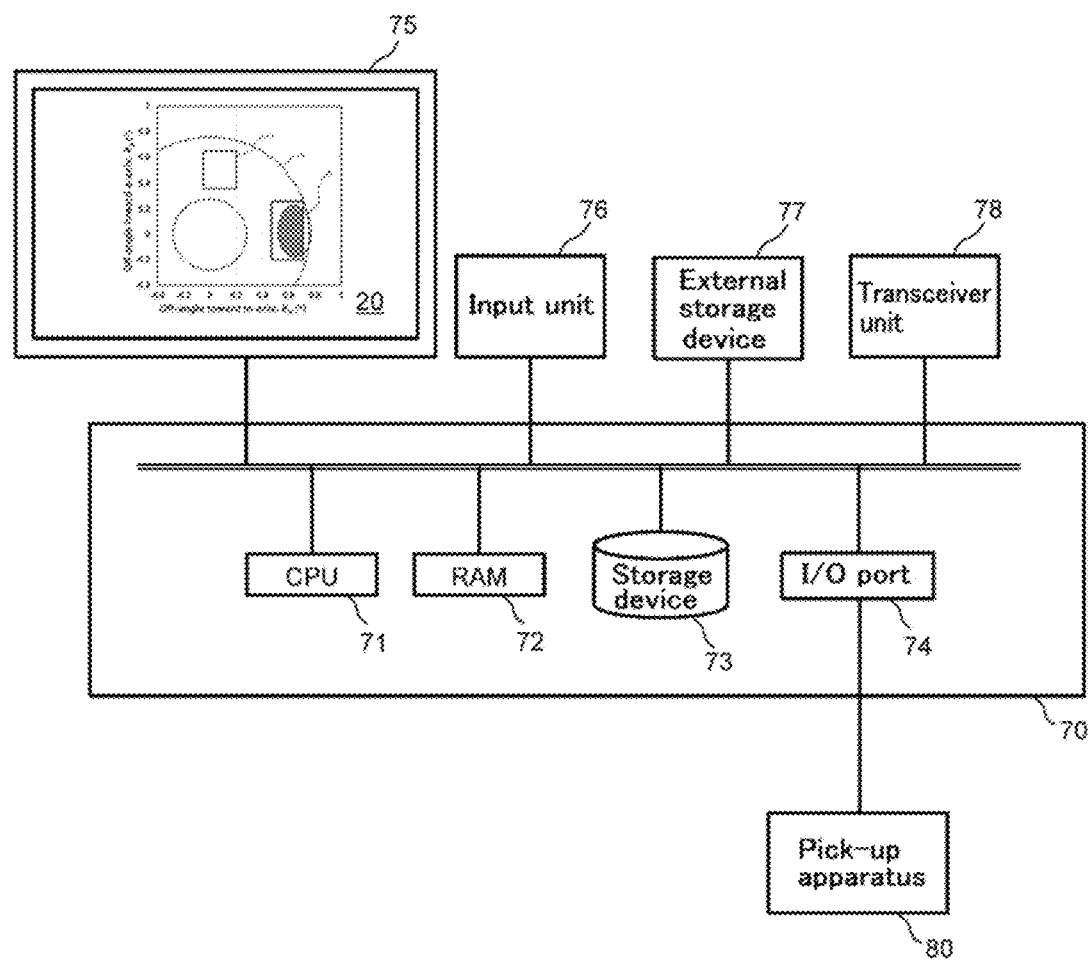
FIG. 7 is a schematic constitution view illustrating a computer executing various programs according to an embodiment of the present invention.

Next, the substrate selection program, the substrate data output program, the semiconductor device selection program, and the off-angle coordinate map according to this embodiment, and a computer for executing them will be described with reference to FIG. 7. FIG. 7 is a schematic constitution view illustrating a computer executing various programs according to this embodiment.

Various Programs and Off-Angle Coordinate Map

The substrate selection program according to this embodiment is used, for example, on the side of manufacturers of a substrate 10 or a semiconductor laminate, and makes the computer execute selection of the substrate 10 after fabrication of the substrate 10. Specifically, the substrate selection program selects the substrates 10 by ranking, for example, based on the proportion of the area of the region where the off-angle ($\theta_m$, $\theta_a$) obtained by the formula (1) satisfies a predetermined condition in the main surface 10s of the aforementioned substrate 10 with respect to the total area of the main surface 10s. In addition, the substrate selection program can determine that each substrate 10 is, for example, excluded from shipment based on a rank given to the substrate 10, or included in shipment corresponding to a price predetermined for each rank of the substrate 10.

The substrate data output program according to this embodiment is used, for example, on the side of users (semiconductor device manufacturers) to whom the substrate 10 or the semiconductor laminate is provided, and makes a computer execute output of data regarding the state of the main surface 10s of the substrate 10. Specifically, for example, when an arbitrary position (x, y) in the main surface 10s of the aforementioned substrate 10 is input, the substrate data output program outputs an off-angle ($\theta_m$, $\theta_a$) at the position (x, y) by the formula (1) to a display unit described later. Further, the substrate data output program causes the display unit to display, for example, an off-angle coordinate map 20 wherein the off-angle m-axis component $\theta_m$ and the off-angle a-axis component $\theta_a$ are coordinate axes, and causes a range of the main surface 10s of the substrate 10 to be displayed on the off-angle coordinate map 20 based on the off-angle ($\theta_m$, $\theta_a$) at a position (x, y) on an outer edge of the main surface 10s of the substrate 10, output by the formula (1).

Furthermore, a semiconductor device selection program according to this embodiment is used, for example, on the side of users to whom a substrate 10 or the semiconductor laminate is provided, and makes a computer to cause the pick-up apparatus to execute selective pick-up of a semiconductor device, when the semiconductor device is manufactured using the substrate 10. Specifically, the substrate selection program makes the computer cause the pick-up apparatus to execute selective pick-up of the semiconductor device at a predetermined position (x, y) as a good product when the off-angle ($\theta_m$, $\theta_a$) obtained at the predetermined position in the main surface 10s of the substrate 10 by the formula (1) satisfies a predetermined condition.

A manufacturing method using the aforementioned various programs will be described in detail later.

Computer

As illustrated in FIG. 7, the computer 70 is prepared and constituted to execute various programs according to this embodiment, for example, on the side of the manufacturer manufacturing the substrate 10 or the semiconductor laminate, or on the side of the user to whom the substrate 10 or the semiconductor laminate is provided. Specifically, the computer 70 has, for example, a Central Processing Unit (CPU) 71, a Random Access Memory (RAM) 72, a storage device 73, and an I/O port 74. The RAM 72, the storage device 73, and the I/O port 74 are constituted to be able to exchange data with the CPU 71. Further, the computer 70 is connected to a display unit (output unit) 75, an input unit 76, an external storage device 77, and a transceiver unit 78.

The storage device 73 is constituted as a computer-readable recording medium, and includes, for example, a flash memory, a hard disk drive (HDD), and the like. In the storage device 73, various programs according to this embodiment, the off-angle coordinate map 20, and the like are stored so as to be readable.

The RAM 72 is constituted to temporarily hold various programs, etc., that are read out from the storage device 73 by the CPU 71.

The CPU 71 is constituted to read and execute various programs and the like stored in the storage device 73.

The external storage device 77 is constituted as a portable and computer-readable recording medium, and includes, for example, a magnetic tape, a magnetic disk, an optical disk, an optical magnetic disk, a flash memory, and the like. The aforementioned various programs can be installed in the computer 70 using, for example, the external storage device 77.

The transceiver unit 78 is constituted to transceive information to the outside via the Internet or a dedicated line, for example. The aforementioned various programs may be installed in the computer 70 using, for example, the transceiver unit 78 via the Internet or the dedicated line.

The display unit 75 is constituted to display an off-angle at a predetermined position in the main surface 10s of the substrate 10, an off-angle coordinate map 20, or the like, to the aforementioned manufacturer, user, or the like, and examples thereof include, for example, a liquid crystal display. The input unit 76 is constituted such that the aforementioned manufacturer or user or the like inputs information (e.g., input of a position of the main surface 10s of the substrate 10) to the computer 70, and examples thereof include a mouse and a keyboard. It should be noted that the display unit 75 and the input unit 76 may be constituted to be combined as a touchscreen display. Alternatively, the display unit 75 may be a printer for outputting printed matter.

The I/O port 74 is connected to the pick-up apparatus 80, for example. Thereby, the computer 70 can control the pick-up apparatus 80.

The pick-up apparatus 80 is constituted to pick-up, for example, a semiconductor device cut from the semiconductor laminate.

On the side of the manufacturer of the substrate 10 or the semiconductor laminate, the semiconductor device selection program does not have to be installed in the computer 70 that causes the substrate selection program to be executed. In this case, the computer 70 does not have to be connected to the pick-up apparatus 80 via the I/O port 74.

Meanwhile, on the side of the user to whom the substrate 10 or the semiconductor laminate is provided, the semiconductor device selection program does not have to be installed in the computer 70 that causes the substrate data output program or the substrate selection program to be executed.

(3) Nitride Semiconductor Substrate Provided with Substrate Data Output Program and the Like The aforementioned substrate 10 of this embodiment is provided together with, for example, a substrate data output program, a semiconductor device selection program, or an off-angle coordinate map 20. A substrate 10 provided along with a substrate data output program, a semiconductor device selection program, or an off-angle coordinate map 20 is referred to as a "substrate provided with a substrate data output program", a "substrate provided with a semiconductor device selection program" or a "substrate provided with an off-angle coordinate map", respectively.

The expression "provided with" used herein means to include the cases: (1) where a tray containing the substrate 10 or an enclosed material is accompanied by a program, an information to be entered therein, or the like; and (2) where at least one of a program, an information to be entered therein, and the like is provided so as to be downloadable via the Internet, a dedicated line, or the like. The same applies to the expression "provided with" in the context of an off-angle coordinate map 20 output by the program. Note that, the off-angle coordinate map 20 in this case may be a printed matter.

A semiconductor laminate of this embodiment explained later may also be provided together with, for example, a substrate data output program, a semiconductor device selection program, or an off-angle coordinate map 20. In this case, a semiconductor laminate provided along with a substrate data output program, a semiconductor device selection program, or an off-angle coordinate map 20 is referred to as a "semiconductor laminate provided with a substrate data output program", a "semiconductor device selection program" or a "semiconductor laminate provided with an off-angle coordinate map", respectively.

(4) Manufacturing Method

Figure 8:
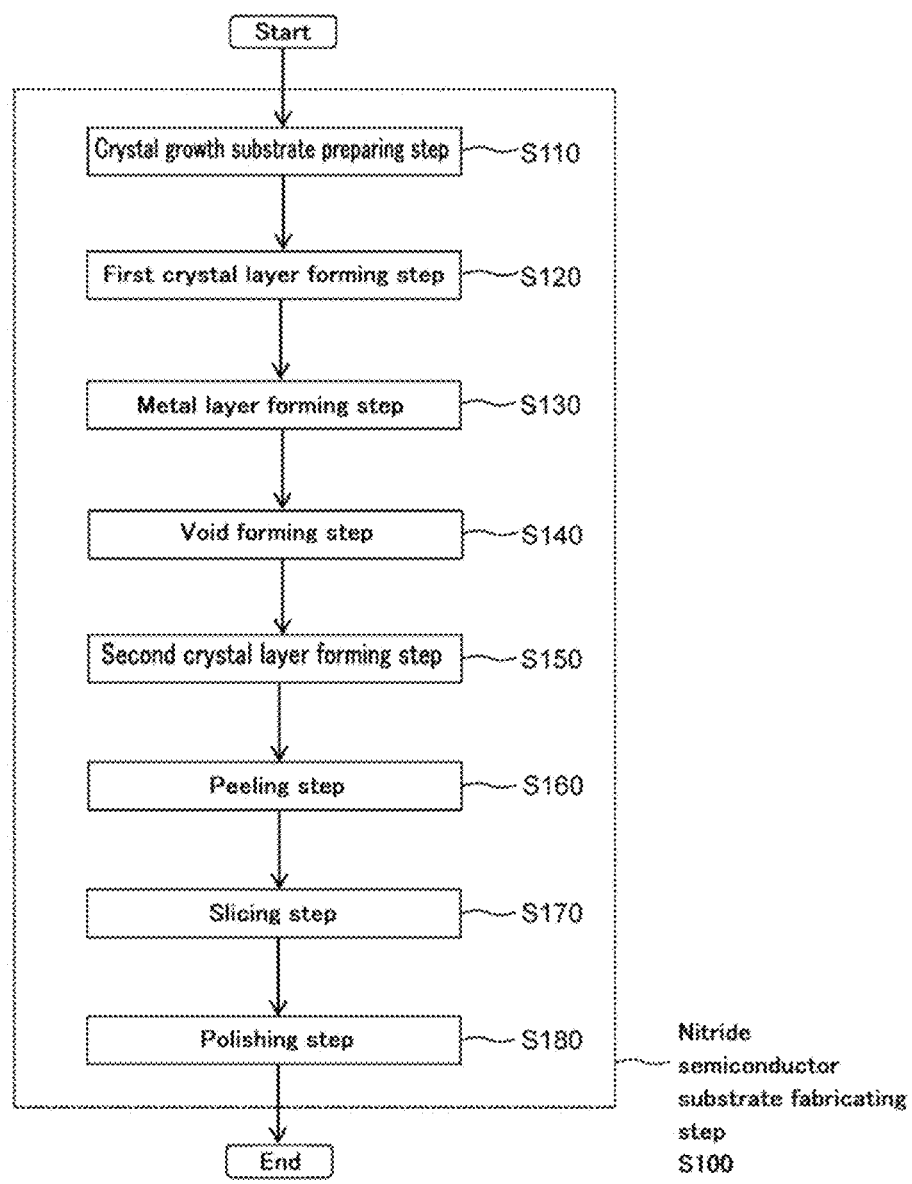
FIG. 8 is a flowchart illustrating a part of a manufacturing method of a nitride semiconductor substrate according to an embodiment of the present invention.
Figure 9:
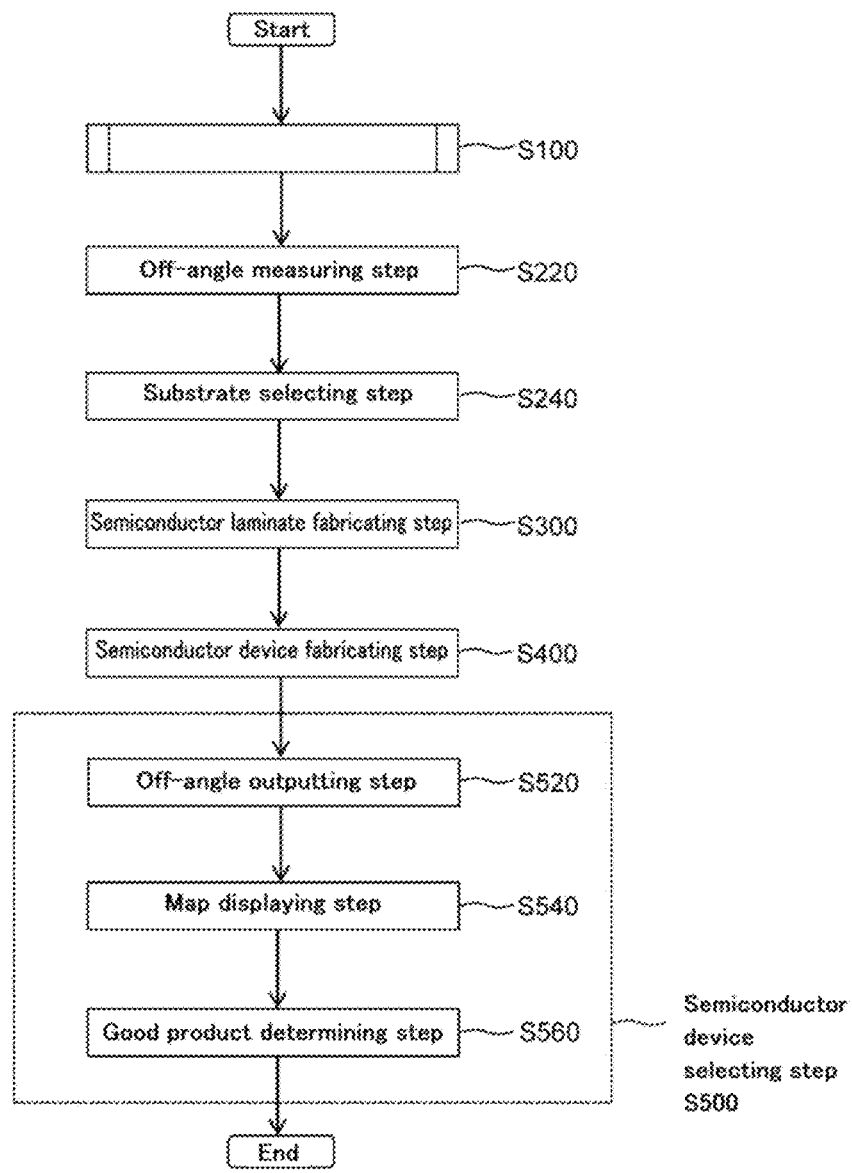
FIG. 9 is a flowchart illustrating a manufacturing method of a semiconductor device according to an embodiment of the present invention.

Next, explanation is given for a nitride semiconductor substrate manufacturing method according to this embodiment, a semiconductor laminate manufacturing method according to this embodiment, a semiconductor device manufacturing method according to this embodiment, and a substrate data output method according to this embodiment, with reference to FIG. 8 to FIG. 11. FIG. 8 is a flowchart illustrating a part of a nitride semiconductor substrate manufacturing method according to this embodiment. FIG. 9 is a flowchart illustrating a semiconductor device manufacturing method according to this embodiment. FIG. 10(a) to FIG. 10(g) are schematic cross-sectional views illustrating a part of a nitride semiconductor substrate manufacturing method according to this embodiment. FIG. 11(a) to FIG. 11(c) are schematic cross-sectional views illustrating a part of a nitride semiconductor substrate manufacturing method according to this embodiment. FIG. 12(a) to FIG. 12(c) are schematic cross-sectional views illustrating a part of a semiconductor device manufacturing method according to this embodiment.

As illustrated in FIG. 9, the manufacturing method of a semiconductor device according to this embodiment includes: for example, a nitride semiconductor substrate fabricating step S100; an off-angle measuring step S220; a substrate selecting step S240; a semiconductor laminate fabricating step S300; a semiconductor device fabricating step S400; and a semiconductor device selecting step S500.

S100: Nitride Semiconductor Substrate Fabricating Step

A nitride semiconductor substrate fabricating step S100 is performed to fabricate the substrate 10 according to this embodiment. In the nitride semiconductor substrate fabricating step S100 of this embodiment, for example, the substrate 10 is fabricated by a VAS (Void-Assisted Separation) method.

As illustrated in FIG. 8, specifically, the nitride semiconductor substrate fabricating step S100 of this embodiment includes, for example a crystal growth substrate preparing step S110; a first crystal layer forming step S120; a metal layer forming step S130; a void forming step S140; a second crystal layer forming step S150; a peeling step S160; a slicing step S170; and a polishing step S180.

S110: Crystal Growth Substrate Preparing Step

Figure 10A:
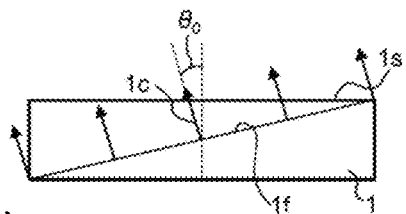
FIG. 10(a) to FIG. 10(g) are schematic cross-sectional views illustrating a part of a manufacturing method of a nitride semiconductor substrate according to an embodiment of the present invention.

First, as illustrated in FIG. 10(a), a crystal growth substrate 1 (sometimes abbreviated as "substrate 1" hereafter) is prepared. The substrate 1 is, for example, a sapphire substrate. The substrate 1 may be, for example, a Si substrate or a gallium arsenide (GaAs) substrate. The substrate 1 has, for example, a main surface is which is to be a growth surface. The low index crystal plane nearest to the main surface $1s$ is, for example, a c-face $1f$.

In this embodiment, the c-face $1f$ of the substrate 1 is inclined with respect to the main surface $1s$. The c-axis $1c$ of the substrate 1 is inclined at a predetermined off-angle $\theta_0$ with respect to the normal of the main surface $1s$. The off-angle $\theta_0$ in the main surface is of the substrate 1 is uniform over the entire main surface is. The off-angle $\theta_0$ in the main surface is of the substrate 1 affects $(M_2, A_2)$ as the off-angle $(\theta_m, \theta_a)$ at the center O of the main surface $10s$ of the substrate 10.

S120: First Crystal Layer Forming Step

Figure 10B:
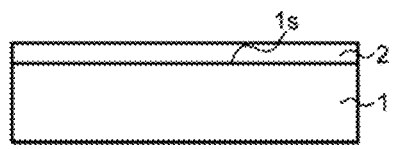

Next, as illustrated in FIG. 10(b), for example, a low-temperature-grown GaN buffer layer and a single-crystal Si-doped GaN layer as a first crystal layer (base growth layer) 2 are grown in this order on the main surface is of the substrate 1, by supplying trimethylgallium (TMG) gas, ammonia gas ($NH_3$) and monosilane ($SiH_4$) gas to the substrate 1 heated to a predetermined growth temperature, by a metal organic vapor phase epitaxy (MOVPE) method, for example. At this time, the thickness of the low-temperature-grown GaN buffer layer and the thickness of the Si-doped GaN layer are, for example, 20 nm and 0.5 µm, respectively.

S130: Metal Layer Forming Step

Figure 10C:
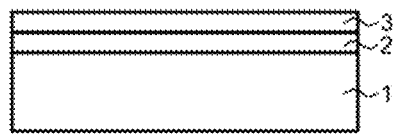

Next, as illustrated in FIG. 10(c), a metal layer 3 is deposited on the first crystal layer 2. The metal layer 3 is, for example, a titanium (Ti) layer. Further, the thickness of the metal layer 3 is, for example, 20 nm.

S140: Void Forming Step

Figure 10D:
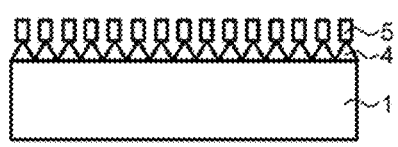
Figure 10E:
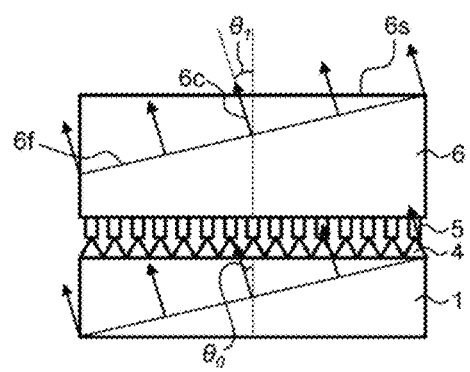

Next, as illustrated in FIG. 10(d), the aforementioned substrate 1 is put in an electric furnace, and the substrate 1 is placed on a susceptor having a predetermined heater. After placing the substrate 1 on the susceptor, the substrate 1 is heated by a heater, and heat treatment is performed in an atmosphere containing hydrogen gas or hydride gas. Specifically, for example, heat treatment is performed for 20 minutes at a predetermined temperature in a hydrogen ($H_2$) gas flow containing 20% $NH_3$ gas as nitriding gas. The heat treatment temperature is, for example, 850° C. or more and 1100° C. or less. By performing such a heat treatment, the metal layer 3 is nitrided, and a metal nitride layer 5 having fine holes at high density on the surface is formed. Further, by performing the above heat treatment, a part of the first crystal layer 2 is etched through the hole of the metal nitride layer 5 to form high density void in the first crystal layer 2. Therefore, a void-containing first crystal layer 4 is formed.

In this case, for example, a "void formation rate (volume porosity)" indicative of the proportion in volume of the voids in the void-containing first crystal layer 4 is made concentrically equal in the circumferential direction of a circle or ellipse sharing the center with the substrate 1. The phrase "to be concentrically equal in the circumferential direction of a circle or ellipse sharing the center with the substrate 1" can be restated as "to be equal in the circumferential direction of a circle concentric with the substrate 1 or an ellipse concentric with the substrate 1". In a specific method, for example, the aforementioned heat treatment is performed while rotating the susceptor on which the substrate 1 is placed. It is also possible to, for example, adjust the degree to which the heater heats in the face of the substrate 1, thereby making the temperature of the substrate 1 in the temperature distribution of the substrate 1 concentrically equal in the circumferential direction of a circle or ellipse sharing the center with the substrate 1. Thereby, voids can be equally formed in the circumferential direction in the void-containing first crystal layer 4. As a result, the void formation rate of the void-containing first crystal layer 4 can be made concentrically equal in the circumferential direction of a circle or ellipse sharing the center with the substrate 1.

At this time, for example, the void formation rate of the void-containing first crystal layer 4 is monotonically (e.g., linearly) increased from the center side toward the outer circumference side in a radial direction of the substrate 1. Specifically, for example, in the temperature distribution of the substrate 1, the temperature of the substrate 1 is monotonically increased from the center side toward the outer circumference side in the radial direction of the substrate 1. Examples of a method to obtain the temperature distribution of the substrate 1 include: a method of adjusting the degree to which the heater heats in the face of the substrate 1 to obtain the aforementioned temperature distribution; a method of bringing only the outer circumference side of the substrate 1 into contact with the susceptor by utilizing convex warpage generated on the front surface side of the substrate 1 due to the linear expansion coefficient difference between the substrate 1 and the first crystal layer 2 when the first crystal layer 2 is formed, to obtain the aforementioned temperature distribution; a method of making the placement surface of the susceptor concavely curved so that only the outer circumference side of the substrate 1 is brought into contact with the susceptor, to obtain the aforementioned temperature distribution; and the like. As described above, since the temperature of the substrate 1 is monotonically increased from the center side to the outer circumference side in the radial direction of the substrate 1, the void formation rate of the void-containing first crystal layer 4 can be monotonically increased from the center side to the outer circumference side in the radial direction of the substrate 1.

At this time, for example, the void formation rate of the void-containing first crystal layer 4 is 10% or more and 90% or less from the center side toward the outer circumference side in a radial direction of the substrate 1. With the void formation rate of 10% or more, the second crystal layer 6 can be stably peeled in the peeling step S160 described later. On the other hand, with the void formation rate of 90% or less, the peeling can be suppressed from occurring during growth of the second crystal layer 6 in the second crystal layer forming step S150 described later.

S150: Second Crystal Layer Forming Step

Next, for example, Si-doped GaN layer as a second crystal layer (full-growth layer) 6 is epitaxially grown on the void-containing first crystal layer 4 and the metal nitride layer 5, by supplying gallium chloride (GaCl) gas, NH$_3$ gas and dichlorosilane (SiH$_2$Cl$_2$) gas as n-type dopant gas, to the substrate 1 heated to a predetermined growth temperature, by a hydride vapor phase epitaxy (HVPE) method. A Ge-doped GaN layer may also be epitaxially grown as the second crystal layer 6 by supplying tetrachlorogermane (GeCl$_4$) gas or the like as the n-type dopant gas, instead of the SiH$_2$Cl$_2$ gas.

At this time, the second crystal layer 6 grows on the void-containing first crystal layer 4 and the metal nitride layer 5, from the void-containing first crystal layer 4 through the holes of the metal nitride layer 5. Although a part of the voids in the void-containing first crystal layer 4 is buried by the second crystal layer 6, the other part of the voids in the void-containing first crystal layer 4 is remained. A flat air gap is formed between the second crystal layer 6 and the metal nitride layer 5, due to the voids remaining in the void-containing first crystal layer 4. A flat air gap (size and density thereof) formed between the second crystal layer 6 and the metal nitride layer 5 depends on the void formation rate in the aforementioned void-containing first crystal layer 4. This air gap causes peeling of the second crystal layer 6 in a peeling step S160 described later.

At this time, an "initial nucleus" which is a crystal nucleus in an early stage of growth of the second crystal layer 6 is generated corresponding to the void formation rate of the void-containing first crystal layer 4. The higher the void formation rate of the void-containing first crystal layer 4, the lower the density of the initial nucleus in the second crystal layer 6. The density of the initial nucleus in the second crystal layer 6 affects, for example, tensile stress generated in the second crystal layer 6, and a difference in dislocation density in the thickness direction of the second crystal layer 6.

The tensile stress generated in the second crystal layer 6 has the following tendency. In the growth process of the second crystal layer 6, when the island-shaped initial nucleus grows laterally and gets closer to the adjacent initial nuclei, it is energetically stable for two surfaces of initial nuclei to be united rather than to exist separately. Therefore, the adjacent initial nuclei are forcibly attracted (associated) with each other. Since the initial nuclei are bound to the substrate 1 side, tensile stress is introduced between adjacent initial nuclei. This is described in W. D. Nix and B. M. Clemens, J. Mater. Res., 14 (1999) 3467. The lower the density of the initial nuclei in the second crystal layer 6, the larger the island-shaped initial nuclei grow until being associated. The larger the size of the island-shaped initial nucleus just before being associated, the lower the density of the associated portion of the adjacent initial nuclei and the lower the tensile stresses between the adjacent initial nuclei.

The difference in dislocation density in the thickness direction of the second crystal layer 6 has the following tendency. In the growth process of the second crystal layer 6, when the density of the initial nucleus in the second crystal layer 6 is low, the island-shaped initial nuclei grow larger until being associated so that the lateral growth of the initial nuclei is promoted, as described above. Thereby, as the second crystal layer 6 grows, the dislocation in the second crystal layer 6 is reduced rapidly. As the result, the lower the density of the initial nucleus in the second crystal layer 6, the smaller the difference in dislocation density in the thickness direction of the second crystal layer 6.

In this embodiment, according to the distribution of the void formation rate of the void-containing first crystal layer 4, the density of the initial nucleus in the second crystal layer 6 is made concentrically equal in the circumferential direction of a circle or ellipse sharing the center with the substrate 1, and, at the same time, the density of the initial nucleus is monotonically (e.g., linearly) decreased from the center side toward the outer circumference side in a radial direction of the substrate 1. Thereby, the tensile stress generated in the second crystal layer 6 is made concentrically equal in the circumferential direction of a circle or ellipse sharing the center with the substrate 1, and, at the same time, the tensile stress is monotonically decreased from the center side toward the outer circumference side in a radial direction of the substrate 1. Further, the difference in dislocation density in the thickness direction of the second crystal layer 6 can be made concentrically equal in the circumferential direction of a circle or ellipse sharing the center with the substrate 1, and, at the same time, the difference in dislocation density in the thickness direction can be monotonically decreased from the center side toward the outer circumference side in a radial direction of the substrate 1.

Further, at this time, the second crystal layer 6 is grown incorporating an orientation of the substrate 1. That is, the off-angle $\theta_1$ in the main surface of the second crystal layer 6 is uniform over the entire main surface, like the off-angle $\theta_0$ in the main surface is of the substrate 1.

Further, at this time, after the second crystal layer 6 is flattened, the flat second crystal layer 6 is grown with only the c-face as a growth surface, without causing facets other than the c-face to generate on the main surface of the second crystal layer 6 (without three-dimensional growth).

Further, at this time, the thickness of the second crystal layer 6 is, for example, 600 μm or more, preferably 1 mm or more. An upper limit value of the thickness of the second crystal layer is not particularly limited. However, it is preferable that the thickness of the second crystal layer 6 be 50 mm or less, from a viewpoint of productivity improvement.

S160: Peeling Step

After completion of the growth of the second crystal layer 6, the second crystal layer 6 spontaneously peels from the substrate 1, with the void-containing first crystal layer 4 and the metal nitride layer 5 serving as boundaries, in the process of cooling the HVPE apparatus used for growing the second crystal layer 6.

At this time, tensile stress is introduced into the second crystal layer 6, as described above. Therefore, internal stress acts on the second crystal layer 6 such that the front surface side of the second crystal layer 6 is concave due to the tensile stress generated in the second crystal layer 6. Further, the dislocation density on the main surface (front surface) side of the second crystal layer 6 is low, whereas the dislocation density on the back surface side of the second crystal layer 6 is high. Therefore, the internal stress acts on the second crystal layer 6 such that the front surface side of the second crystal layer 6 is concave also due to a difference in dislocation density in the thickness direction of the second crystal layer 6.

Figure 10F:
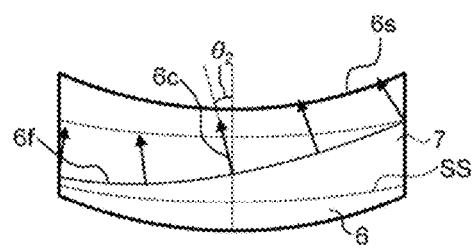

As a result, as illustrated in FIG. 10(f), after the second crystal layer 6 is peeled from the substrate 1, the second crystal layer 6 warps so that the front surface side is concave. Therefore, the c-face 6f of the second crystal layer 6 is curved in a concave spherical shape with respect to a surface perpendicular to the normal direction of the center of the main surface 6s of the second crystal layer 6. The off-angle $\theta_2$ formed by the c-axis 6c with respect to the normal of the center of the main surface 6s of the second crystal layer 6 has a predetermined distribution.

At this time, in the aforementioned second crystal layer forming step S150, the tensile stress generated in the second crystal layer 6 is made concentrically equal in the circumferential direction of a circle or ellipse sharing the center with the substrate 1, and, at the same time, the tensile stress is monotonically decreased from the center side toward the outer circumference side in a radial direction of the substrate 1, according to the distribution of the density of the initial nucleus in the second crystal layer 6. Further, the difference in dislocation density in the thickness direction of the second crystal layer 6 is made concentrically equal in the circumferential direction of a circle or ellipse sharing the center with the substrate 1, and, at the same time, the difference in dislocation density in the thickness direction is monotonically decreased from the center side toward the outer circumference side in a radial direction of the substrate 1. Thereby, the internal stress warping the second crystal layer 6 so as to be concave can be made concentrically equal in the circumferential direction of a circle or ellipse sharing the center with the substrate 1, and, at the same time, the internal stress warping the second crystal layer 6 so as to be concave can be monotonically decreased from the center side toward the outer circumference side in a radial direction of the substrate 1.

As described above, since the internal stress warping the second crystal layer 6 so as to be concave is generated, the second crystal layer 6 can be warped symmetrically around the normal of the center of the main surface 6s, for example, in each of the cross-section along m-axis and the cross-section along a-axis. Thereby, the c-face 6f of the second crystal layer 6 can be a curved surface shape that is approximated to a spherical surface in each of its cross-sections along m-axis and along a-axis. As a result, in the finally obtained substrate 10, the off-angle ($\theta_m$, $\theta_a$) at an arbitrary position (x, y) in the main surface 10s can be approximately represented by the aforementioned formula (1).

Moreover, at this time, since the void formation rate of the void-containing first crystal layer 4 is made concentrically equal in the circumferential direction of a circle or ellipse sharing the center with the substrate 1 in the aforementioned void forming step S140, the second crystal layer 6 can be peeled equally from the outer circumference in the circumferential direction of the substrate 1.

Moreover, at this time, since the void formation rate of the void-containing first crystal layer 4 is monotonically increased from the center side toward the outer circumference side in a radial direction of the substrate 1 in the aforementioned void forming step S140, the second crystal layer 6 can be gradually peeled from the outer circumference side toward the center side in the circumferential direction of the substrate 1. When the second crystal layer 6 is gradually peeled from the outer circumference side in the radial direction of the substrate 1, N of GaN included in the void-containing first crystal layer 4 is eliminated from where the second crystal layer 6 is peeled, while metal $\theta_a$ remains. Further, the second crystal layer 6 is gradually peeled toward the center side in the radial direction of the substrate 1, so that the central position of the final contact range which remains as (a liquid film of) metal $\theta_a$ between the second crystal layer 6 and the substrate 1 can be an approximate center of the substrate 1. Specifically, for example, the diameter of the final contact range between the second crystal layer 6 and the substrate 1 can be 10 mm or more and 20 mm or less. Moreover, for example, the central position of the final contact range between the second crystal layer 6 and the substrate 1 can be within 5 mm, preferably within 1 mm from the center of the substrate 1.

As described above, since the second crystal layer 6 is peeled from the substrate 1, the second crystal layer 6 can be warped symmetrically around the normal of the center of the main surface 6s, for example, in each of the cross-section along m-axis and the cross-section along a-axis.

Further, at this time, since the second crystal layer 6 is grown with only the c-face as a growth surface in the aforementioned second crystal layer forming step S150, the stress toward the center of the radial direction in the second crystal layer 6 can be approximately equal in the circumferential direction when the second crystal layer 6 is peeled from the substrate 1. Since the stress in the second crystal layer 6 is equal, the second crystal layer 6 can be warped symmetrically around the normal of the center of the main surface 6s, for example, in each of the cross-section along m-axis and the cross-section along a-axis.

Further, at this time, the warpage of the second crystal layer 6 may have direction dependence in some cases. For example, when the void formation rate of the void-containing first crystal layer 4 is made concentrically equal in the circumferential direction of a ellipse sharing the center with the substrate 1, the direction dependence can be caused in the density of the initial nucleus in the second crystal layer 6. Thereby, it is possible to cause direction dependence in the tensile stress generated in the second crystal layer 6 and in the difference in dislocation density in the thickness direction of the second crystal layer 6. As a result, the warpage in the direction along m-axis of the second crystal layer 6 can be different from the warpage in the direction along a-axis of the second crystal layer 6.

Since the direction dependence in the warpage of the second crystal layer 6 is utilized, the radius of curvature of the c-face 6f in the direction along m-axis can be different from the radius of curvature of the c-face 6f in the direction along a-axis, in the second crystal layer 6. As a result, in the finally obtained substrate 10, an absolute value of a rate of change in the off-angle m-axis component $\theta_m$, $|M_1|$, can be different from an absolute value of a rate of change in the off-angle a-axis component $\theta_a$, $|A_1|$.

Furthermore, since the direction dependence in the warpage of the second crystal layer 6 is utilized, for example, the radius of curvature of the c-face 6f in the direction along m-axis can be larger than the radius of curvature of the c-face 6f in the direction along a-axis, in the second crystal layer 6. As a result, in the finally obtained substrate 10, the absolute value of a rate of change in the off-angle m-axis component $\theta_m$, $|M_1|$, can be smaller than an absolute value of a rate of change in the off-angle a-axis component $\theta_a$, $|A_1|$.

Moreover, at this time, since the thickness of the second crystal layer 6 is 1 mm or more in the aforementioned second crystal layer forming step S150, the warpage of the second crystal layer 6 can be reduced. Thereby, the radius of curvature of the c-face 6f in the second crystal layer 6 can be suppressed from becoming excessively small, and thus the deviation of the c-face 6f in the second crystal layer 6 from the curved surface ideally approximated to a spherical surface can be reduced. As a result, at an arbitrary position on the main surface 10s of the finally obtained substrate 10, an error of the off-angle actually measured with respect to the off-angle obtained by the formula (1), $\Delta\theta$, can be within ±0.12°, preferably within 0.060.

S170: Slicing Step

Next, as illustrated in FIG. 10(f), for example, a wire saw is guided to a cut surface SS approximately perpendicular to the normal direction of the center of the main surface 6s of the second crystal layer 6 to slice the second crystal layer 6. Thereby, an as-sliced substrate 7 (sometimes abbreviated as "substrate 7" hereafter) is formed. A thickness of the substrate 7 is, for example, 450 μm.

In this situation, even when the wire saw is guided to a cut surface SS perpendicular to the normal direction of the center of the main surface 6s of the second crystal layer 6, the wire saw may be actually deflected in some cases. Therefore, the actual cut surface SS may be, for example, concavely curved only in a predetermined direction with respect to the ideally perpendicular surface with respect to the normal of the center of the main surface 6s of the second crystal layer 6.

Accordingly, in this embodiment, the direction dependence of the aforementioned wire saw is actively utilized. For example, the direction, in which the actual cut surface SS is concavely curved with respect to ideally perpendicular surface with respect to the normal of the center of the main surface 6s of the second crystal layer 6, is oriented to a direction along m-axis or a direction along a-axis in the second crystal layer 6. Thereby, in the substrate 7, the radius of curvature of the c-face 7f in the direction along m-axis can be different from the radius of curvature of the c-face 7f in the direction along a-axis. As a result, in the finally obtained substrate 10, an absolute value of a rate of change in the off-angle m-axis component $\theta_m$, $|M_1|$, can be different from an absolute value of a rate of change in the off-angle a-axis component $\theta_a$, $|A_1|$.

In this embodiment, for example, since the direction in which the actual cut surface SS is concavely curved is the direction along m-axis of the second crystal layer 6, the degree of curvature of the c-face 7f in the direction along m-axis can be reduced, in the substrate 7. That is, the radius of curvature of the c-face 7f in the direction along m-axis can be larger than the radius of curvature of the c-face 7f in the direction along a-axis, in the substrate 7. As a result, in the finally obtained substrate 10, the absolute value of a rate of change in the off-angle m-axis component $\theta_m$, $|M_1|$, can be smaller than an absolute value of a rate of change in the off-angle a-axis component $\theta_a$, $|A_1|$.

Figure 10G:
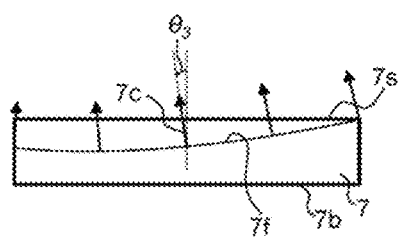

According to this step, as illustrated in FIG. 10(g), the substrate 7 is obtained. The off-angle θ3 of the substrate 7 may be varied from the off angle θ2 of the second crystal layer 6.

S180: Polishing Step

Next, both surfaces of the substrate 7 are polished by the polishing apparatus.

At this time, in this embodiment, for example, both surfaces of the substrate 7 are polished so that the radius of curvature of the c-face 7f in the surface 7 becomes larger. Further, in this embodiment, for example, both surfaces of the substrate 7 are polished so that the radius of curvature of the c-face 7f in the direction along m-axis is different from the radius of curvature of the c-face 7f in the direction along a-axis, in the substrate 7.

Figure 11A:
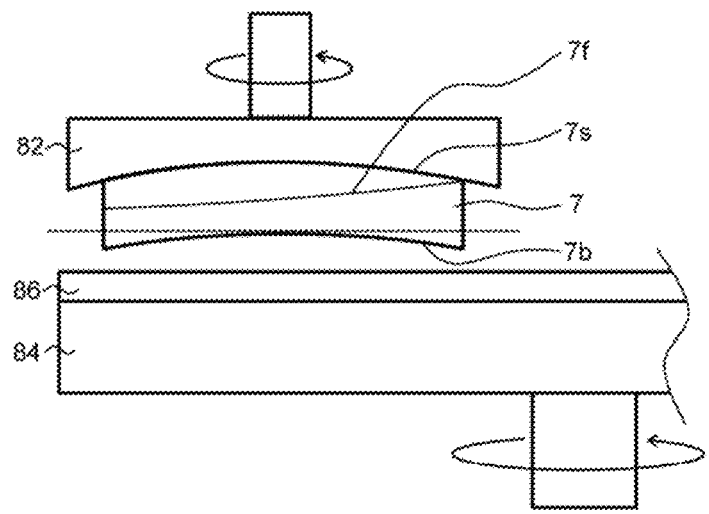
FIG. 11(a) to FIG. 11(c) are schematic cross-sectional views illustrating a part of a manufacturing method of a nitride semiconductor substrate according to an embodiment of the present invention.
Figure 12A:
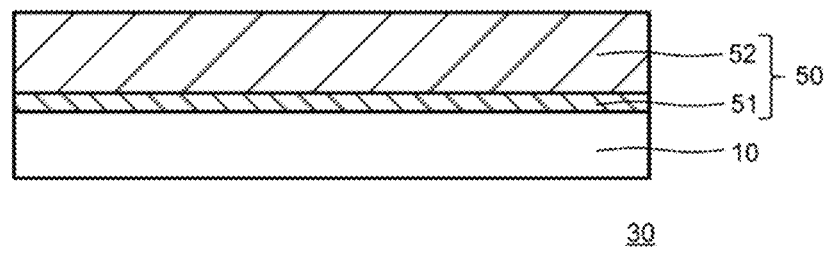
FIG. 12(a) to FIG. 12(c) are schematic cross-sectional views illustrating a part of a manufacturing method of a semiconductor device according to an embodiment of the present invention.
Figure 12B:
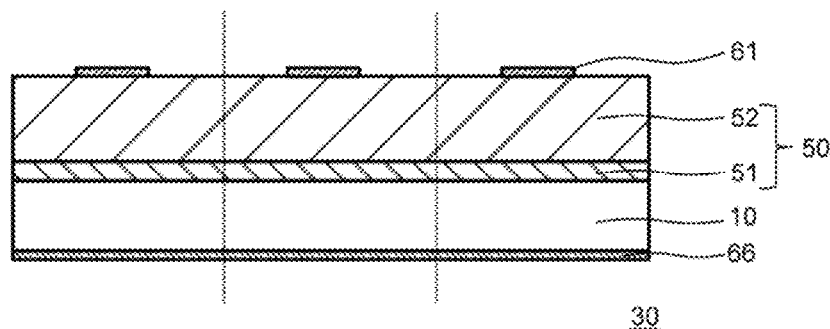
Figure 12C:
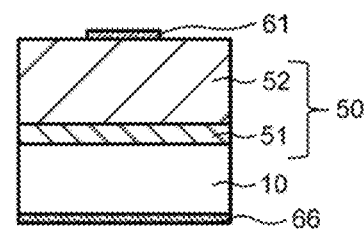

Specifically, as illustrated in FIG. 11(a), the main surface (front surface) 7s side of the substrate 7 is firstly attached to a holder (holding side surface plate) 82 with a wax.

At this time, the attachment surface of the holder 82 is, for example, curved in a concave spherical shape. Since the main surface 7s side of the substrate 7 is attached to the attachment surface of the holder 82, the substrate 7 is warped so that the main surface 7s side of the substrate is curved in a convex spherical shape. Thereby, the radius of curvature of the c-face 7f of the substrate 7 can be larger than that in the state after the slicing step S170.

At this time, the attachment surface of the holder 82 is, for example, in an elliptical spherical surface. In the attachment surface of the holder 82, the axial direction in which a radius of curvature is small, for example, is oriented to the direction along m-axis or along a-axis of the substrate 7. Thereby, the substrate 7 can be warped so that the main surface 7f side thereof is curved in a convex elliptical spherical shape. As a result, in the substrate 7, the radius of curvature of the c-face 7f in the direction along m-axis can be different from the radius of curvature of the c-face 7f in the direction along a-axis.

In this embodiment, in the attachment surface of the holder 82, the axial direction in which a radius of curvature is small, for example, is oriented to the direction along m-axis of the substrate 7. Thereby, in the substrate 7, the radius of curvature of the c-face 7f in the direction along m-axis can be larger than the radius of curvature of the c-face 7f in the direction along a-axis.

After the substrate 7 is attached to the holder 82, each of the holder 82 holding the substrate 7 and the surface plate 84 having a polishing pad 86 is rotated, and the back surface 7b side of the substrate 7 is pressed against the polishing pad 86 while supplying a slurry. Thereby, the concave back surface 7b of the substrate 7 is polished to be a flat surface perpendicular to the normal of the center of the main surface 7f of the substrate 7.

Figure 11B:
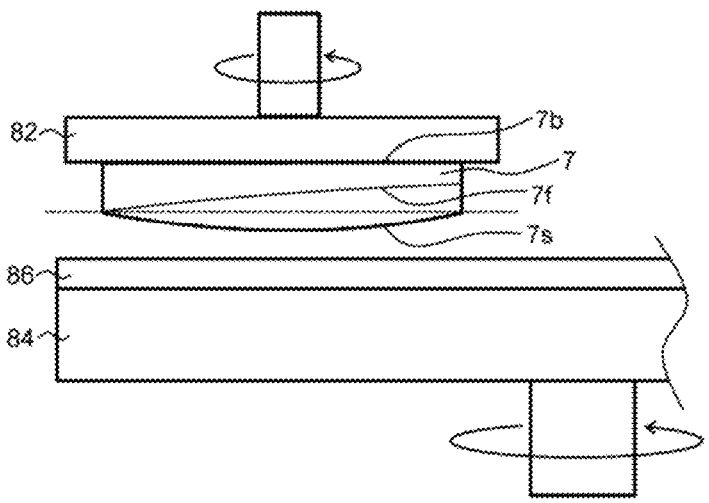

After the back surface 7b of the substrate 7 is polished, the back surface 7b side of the substrate 7 is attached to the holder 82 with a wax, as illustrated in FIG. 11(b). At this time, the attachment surface of the holder 82 is, for example, a flat surface.

After the substrate 7 is attached to the holder 82, each of the holder 82 holding the substrate 7 and the surface plate 84 having a polishing pad 86 is rotated, and the main surface 7s side of the substrate 7 is pressed against the polishing pad 86 while supplying a slurry. Thereby, the convex main surface 7s of the substrate 7 is polished (mirror polished) to be a flat surface perpendicular to the normal of the center of the main surface 7f of the substrate 7.

Figure 11C:
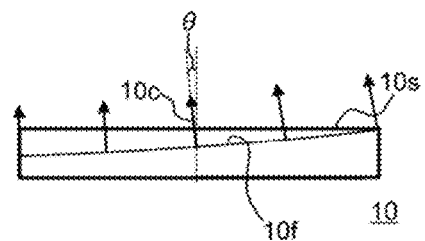

Since the substrate 7 is polished in this way, the substrate 10 is obtained as illustrated in FIG. 11(c).

At this time, in the polishing step S180, since the substrate 7 is polished in the state where the radius of curvature of the c-face 7f of the substrate 7 is larger than that in the state after the slicing step S170, the radius of curvature of the c-face 10f in the finally obtained substrate 10 can be a desired size. That is, the rate of change in the off-angle m-axis component $\theta_m$, $M_1$, and the rate of change in the off-angle a-axis component $\theta_a$, $A_1$, can be adjusted.

In the polishing step S180, since the substrate 7 is polished in the state where the radius of curvature of the c-face 7f in the direction along m-axis in the substrate 7 is different from the radius of curvature of the c-face 7f in the direction along a-axis, the radius of curvature of the c-face 10f in the direction along m-axis can be different from the radius of curvature of the c-face 10f in the direction along a-axis in the finally obtained substrate 10 as well. Thereby, in the substrate 10, an absolute value of a rate of change in the off-angle m-axis component $\theta_m$, $|M_1|$, can be different from an absolute value of a rate of change in the off-angle a-axis component $\theta_a$, $|A_1|$.

In the polishing step S180, since the substrate 7 is polished in the state where the radius of curvature of the c-face 7f in the direction along m-axis in the substrate 7 is larger than the radius of curvature of the c-face 7f in the direction along a-axis, the radius of curvature of the c-face 10f in the direction along m-axis can be larger than the radius of curvature of the c-face 10f in the direction along a-axis in the finally obtained substrate 10. Thereby, in the substrate 10, the absolute value of a rate of change in the off-angle m-axis component $\theta_m$, $|M_1|$, can be smaller than the absolute value of a rate of change in the off-angle a-axis component $\theta_a$, $|A_1|$.

Through the nitride semiconductor substrate fabricating step S100 described above, the substrate 10 can be fabricated so that the off-angle ($\theta_m$, $\theta_a$) at a position (x, y) in the main surface 10s is approximated by the formula (1).

S220: Off-Angle Measuring Step

After fabricating the substrate 10, the off-angle ($\theta_m$, $\theta_a$) is measured at two or more points on the main surface 10s of the substrate 10 by a rocking curve measurement of X-ray diffraction. At this time, when the off-angle ($\theta_m$, $\theta_a$) is measured at only two points, it is preferable that the x coordinate and the y coordinate at the two points are different. It is preferable to measure the off-angle ($\theta_m$, $\theta_a$) at five or more points on the main surface 10s of the substrate 10, from a viewpoint of more accurate measurement. At this time, five or more measuring points preferably include, for example, center O, two points across the center O in the direction along m-axis, and two points across the center O in the direction along a-axis.

After the off-angle ($\theta_m$, $\theta_a$) is measured at two or more points on the main surface 10s of the substrate 10, the constants $M_1$, $A_1$, $M_2$, and $A_2$ in the formula (1) are obtained. When the off-angle ($\theta_m$, $\theta_a$) is measured at three or more points in each of the x direction and the y direction, the constants $M_1$, $A_1$, $M_2$, and $A_2$ are obtained by the least-square method.

After the constants $M_1$, $A_1$, $M_2$, and $A_2$ are obtained, a substrate data output program and a semiconductor device selection program are prepared based on the formula (1) including the constants $M_1$, $A_1$, $M_2$, and $A_2$.

S240: Substrate Selecting Step

After the constants $M_1$, $A_1$, $M_2$, and $A_2$ of the formula (1) are obtained, the manufacturer who have manufactured the substrates 10, for example, makes the computer 70 execute the substrate selection program, and ranks the substrate 10 based on the proportion of the area of the region where the off-angle ($\theta_m$, $\theta_a$) obtained by the formula (1) satisfies a predetermined condition in the main surface 10s of the substrate 10 with respect to the total area of the main surface 10s, to select the substrate.

Specifically, when the proportion of the area of the region where the off-angle ($\theta_m$, $\theta_a$) satisfies the above formula (2) with respect to the total area of the main surface 10s of the substrate 10 is a predetermined value or more, the substrate 10 is ranked as a good product.

Alternatively, when the proportion of the area of the region where the off-angle ($\theta_m$, $\theta_a$) satisfies the above formulas (3-1) and (3-2) with respect to the total area of the main surface 10s of the substrate 10 is a predetermined value or more, the substrate 10 is ranked as a good product.

Alternatively, when the proportion of the area of the region where the off-angle ($\theta_m$, $\theta_a$) satisfies the above formulas (4-1) and (4-2) with respect to the total area of the main surface 10s of the substrate 10 is a predetermined value or more, the substrate 10 is ranked as a good product.

In this case, the product with higher proportion of the area is higher ranked. For example, when the proportion of the area is 50% or more and less than 80%, the product is ranked as a good product, and when the proportion of the area is 80% or more and 100% or less, the product is ranked as a best product. Further, when the proportion of the area is, for example, 10% or less, the substrate 10 is ranked as a defective product and prohibited from being shipped. A relation between the proportion of the area and the rank can be appropriately set.

After ranking the substrate 10, information regarding the rank of the substrate 10 is recorded in the external storage device 77 as a predetermined recording medium. The information regarding the rank of the substrate 10 may be provided so as to be downloadable via the Internet, a dedicated line, or the like, or may be output as a printed matter.

Further, after ranking the substrate 10, the substrate 10 is set as a shipping target in correspondence with a price for the substrate 10 for each predetermined rank, in a case when the substrate 10 is not a defective product. At this time, as the rank of the substrate 10 is higher, a higher price is set, but the price can be appropriately set.

After setting the price of the substrate 10, the information regarding the price of the substrate 10 may be, for example, recorded in the external storage device 77 together with an information regarding the rank of the substrate 10.

S300: Semiconductor Laminate Fabricating Step

Next, a semiconductor layer 50 including a group III nitride semiconductor is epitaxially grown on the substrate 10, and a semiconductor laminate 30 is fabricated. In this embodiment, for example, a laminate constituting SBD is fabricated as the semiconductor laminate 30.

Specifically, as illustrated in FIG. 12(a), first, for example, an n-type GaN layer as a base n-type semiconductor layer 51 is formed on the substrate 10 according to a MOVPE method, by supplying TMG gas, $NH_3$ and n-type dopant gas to the substrate 10 heated to a predetermined growth temperature. At this time, the n-type impurity in the base n-type semiconductor layer 51 is, for example, Si or Ge. Further, the n-type impurity concentration in the base n-type semiconductor layer 51 is equal to the n-type impurity concentration in the substrate 10, and it is $1.0 \times 10^{18}$ $cm^{-3}$ or more and $1.0 \times 10^{19}$ $cm^{-3}$ or less. Further, the thickness of the base n-type semiconductor layer 51 is 0.1 μm or more and 3 μm or less.

After forming the base n-type semiconductor layer 51, an n-type GaN layer as the drift layer 52 is formed on the base n-type semiconductor layer 51. At this time, the n-type impurity in the drift layer 52 is, for example, Si or Ge. Further, the concentration of the n-type impurity in the drift layer 52 is lower than the concentration of the n-type impurity in the substrate 10 and the concentration of the n-type impurity in the base n-type semiconductor layer 51, and it is $1.0 \times 10^{15}$ $cm^{-3}$ or more and $5.0 \times 10^{16}$ $cm^{-3}$ or less. Further, the thickness of the drift layer 52 is thicker than the thickness of the base n-type semiconductor layer 51, and it is 3 μm or more and 40 μm or less. Thus, ON resistance of the semiconductor device 40 described later can be reduced, and a withstand voltage of the semiconductor device 40 can be secured.

As described above, the semiconductor laminate 30 according to this embodiment is fabricated.

In the semiconductor laminate 30 according to this embodiment, for example, when the proportion of the area of the region where the off-angle ($\theta_m$, $\theta_a$) satisfies the formulas (3-1) and (3-2) with respect to the total main surface of the substrate 10, is more than 50% and preferably 80% or more, the proportion of the area of the region where an arithmetic average roughness Ra of the main surface of the semiconductor layer 50 is 30 nm or less and preferably 10 nm or less with respect to the total area of the main surface of the semiconductor layer 50, is more than 50% and preferably 80% or more.

Alternatively, in the semiconductor laminate 30 according to this embodiment, for example, when the proportion of the area of the region where the off-angle ($\theta_m$, $\theta_a$) satisfies the formulas (4-1) and (4-2), with respect to the total main surface of the substrate 10, is more than 50% and preferably 80% or more, the proportion of the area of the region where an arithmetic average roughness Ra of the main surface of the semiconductor layer 50 is 30 nm or less and preferably 10 nm or less, with respect to the total area of the main surface of the semiconductor layer 50, is more than 50% and preferably 80% or more.

The semiconductor laminate 30 of this embodiment is, for example, sold to a user at a price based on the price set to the substrate 10 in the aforementioned substrate selecting step S240. At this time, the semiconductor laminate 30 is provided to the user side together with the information regarding the rank of the aforementioned substrate 10 and the like.

The aforementioned substrate 30 of this embodiment is provided to the user side together with, for example, the aforementioned substrate data output program or semiconductor device selection program. The semiconductor laminate 30 of this embodiment may be provided to the user side together with, for example, the aforementioned off-angle coordinate map 20.

S400: Semiconductor Device Fabricating Step

Next, for example, on the side of user side to whom the semiconductor laminate 30 has been provided, the semiconductor device 40 is fabricated using the semiconductor laminate 30.

Specifically, as illustrated in FIG. 12(b), a p-type electrode 61 is formed at a predetermined position on the drift layer 52. At this time, the p-type electrode 61 is, for example, a palladium (Pd)/nickel (Ni) film.

Further, an n-type electrode 66 is formed on the back surface side of the substrate 10. At this time, the n-type electrode 66 is, for example, a Ti/aluminum (Al) film.

After forming the p-type electrode 61 and the n-type electrode 66, infrared rays are irradiated to the semiconductor laminate 30 in an inert gas atmosphere to anneal the semiconductor laminate 30. Thereby, the adhesiveness of each of the p-type electrode 61 and the n-type electrode 66 is improved, and a contact resistance of each of the p-type electrode 61 and the n-type electrode 66 is reduced.

After annealing the semiconductor laminate 30, the semiconductor laminate 30 is diced and cut into chips of a predetermined size.

As described above, as illustrated in FIG. 12(c), the semiconductor device 40 according to this embodiment is fabricated.

S500: Semiconductor Device Selecting Step

After fabricating the semiconductor device 40, a semiconductor device selecting step S500 is performed, which is the step of selecting the semiconductor device 40 based on the off-angle ($\theta_m$, $\theta_a$) at a position (x, y) in the main surface 10s of the substrate 10. The semiconductor device selecting step S500 of this embodiment includes, for example, an off-angle outputting step S520, a map displaying step S540, and a good product determining step S560.

S520: Off-Angle Outputting Step

Specifically, the user who has fabricated the semiconductor device 40 using the semiconductor laminate 30, for example, makes the computer 70 execute the substrate data output program so that, when an arbitrary position (x, y) in the main surface 10s of the aforementioned substrate 10 is input, the off-angle ($\theta_m$, $\theta_a$) at the position (x, y) is output to a display unit 75 by the formula (1). Specifically, for example, a position (x, y) on an outer edge of the main surface 10s of the substrate 10 is input, and the off-angle ($\theta_m$, $\theta_a$) at the position (x, y) on the outer edge of the main surface 10s is output to a display unit described later.

S540: Map Displaying Step

Next, as illustrated in FIG. 6 and FIG. 7, the display unit 75 is caused to display the off-angle coordinate map 20 wherein the off-angle m-axis component $\theta_m$ and the off-angle a-axis component $\theta_a$ are coordinate axes, and caused to display a range of the main surface 10s of the substrate 10 on the off-angle coordinate map 20 based on the off-angle ($\theta_m$, $\theta_a$) at a position (x, y) on an outer edge of the main surface 10s of the substrate 10, output by the formula (1).

At this time, the region where the off-angle ($\theta_m$, $\theta_a$) satisfies the formula (2), that is, the region overlapping region A in the range of the main surface 10s of the substrate 10 is colored and displayed on the off-angle coordinate map 20. Thereby, it is possible to grasp that the surface morphology of the semiconductor layer 50 is good in at least a part of the region where the off-angle ($\theta_m$, $\theta_a$) satisfies the formula (2).

Further, at this time, the region where the off-angle ($\theta_m$, $\theta_a$) satisfies the formulas (3-1) and (3-2), that is, the region overlapping region B in the range of the main surface 10s of the substrate 10 is colored and displayed on the off-angle coordinate map 20. Thereby, it is possible to grasp that the surface morphology of the semiconductor layer 50 is good over the entire region where the off-angle ($\theta_m$, $\theta_a$) satisfies the formulas (3-1) and (3-2).

Further, at this time, the region where the off-angle ($\theta_m$, $\theta_a$) satisfies the formulas (4-1) and (4-2), that is, the region overlapping region C in the range of the main surface 10s of the substrate 10 is colored and displayed on the off-angle coordinate map 20. Thereby, it is possible to grasp that the surface morphology of the semiconductor layer 50 is good over the entire region where the off-angle ($\theta_m$, $\theta_a$) satisfies the formulas (4-1) and (4-2).

It should be noted that the region where the off-angle ($\theta_m$, $\theta_a$) satisfies the formula (2), the region where the off-angle ($\theta_m$, $\theta_a$) satisfies the formulas (3-1) and (3-2), and the region where the off-angle ($\theta_m$, $\theta_a$) satisfies the formulas (4-1) and (4-2) may be displayed in different colors.

When the off-angle coordinate map 20 is provided in advance, the off-angle outputting step S420 and the map displaying step S440 do not have to be performed.

S560: Good Product Determining Step

After causing a range of the main surface 10s of the substrate 10 to be displayed on the off-angle coordinate map 20, the computer 70 makes the pick-up apparatus 80 cause to execute the semiconductor device selection program to selectively pick-up the semiconductor device 40 based on the off-angle coordinate map 20. For example, when the off-angle ($\theta_m$, $\theta_a$) obtained by the formula (1) satisfies a predetermined condition at a predetermined position (x, y) in the main surface 10s of the substrate 10, the semiconductor device 40 is selectively picked up at the predetermined position.

Specifically, in the semiconductor device 40 cut from the region where the off-angle ($\theta_m$, $\theta_a$) satisfies the formula (2) in the main surface 10s of the actual substrate 10, it is determined that the surface morphology of the semiconductor layer 50 is possibly good, and the semiconductor device 40 is selectively picked up as a good product.

Alternatively, in the semiconductor device 40 cut from the region where the off-angle ($\theta_m$, $\theta_a$) satisfies the formulas (3-1) and (3-2) in the main surface 10s of the actual substrate 10, it is determined that the surface morphology of the semiconductor layer 50 is surely good, and the semiconductor device 40 is selectively picked up as a best product.

Alternatively, in the semiconductor device 40 cut from the region where the off-angle ($\theta_m$, $\theta_a$) satisfies the formulas (4-1) and (4-2) in the main surface 10s of the actual substrate 10, it is determined that the surface morphology of the semiconductor layer 50 is surely good, and the semiconductor device 40 is selectively picked up as a best product.

Meanwhile, in the semiconductor device 40 cut from the region where the off-angle ($\theta_m$, $\theta_a$) does not satisfy the above conditions in the main surface 10s of the actual substrate 10, it is determined that the surface morphology of the semiconductor layer 50 is rough and the semiconductor device 40 is excluded as a defective product.

As described above, the semiconductor device 40 as the SBD of this embodiment is manufactured.

(5) Effects Obtained by this Embodiment

According to this embodiment, one or more of the following effects can be obtained.

(a) In this embodiment, the c-face 10f of the substrate 10 is a curved surface shape that is approximated to a spherical surface in each of its cross-sections along m-axis and along a-axis. In addition, the radius of curvature of the c-face 10f is sufficiently larger than the radius of the substrate 10 in each of cross-sections along m-axis and along a-axis. Thereby, the off-angle ($\theta_m$, $\theta_a$) at an arbitrary position (x, y) in the main surface 10s of the substrate 10 can be approximately represented by the formula (1). The constants $M_1$, $A_1$, $M_2$, and $A_2$ in the formula (1) are adjusted, so that the off-angle distribution (variation in the off-angle) in the main surface 10s of the substrate 10 can be easily adjusted within a predetermined range. As a result, it is possible to easily control the surface morphology of a semiconductor layer 50, which depends on the off-angle in the main surface 10s of the substrate 10.

(b) The off-angle ($\theta_m$, $\theta_a$) in the main surface 10s of the substrate 10 is approximately represented by the formula (1), that is, each of the off-angle m-axis component $\theta_m$ and the off-angle a-axis component $\theta_a$ is approximately represented by the linear formula of x and y, so that the constants $M_1$, $A_1$, $M_2$, and $A_2$ in the formula (1) can be determined by only measuring the off-angle ($\theta_m$, $\theta_a$) at several points on the main surface 10s of the substrate 10, in the off-angle measuring step S220. In other words, the formula (1) can be easily derived from the measurement of the off-angle at several points.

(c) The off-angle ($\theta_m$, $\theta_a$) in the main surface 10s of the substrate 10 is approximately represented by the formula (1), so that the off-angle ($\theta_m$, $\theta_a$) at an arbitrary position (x, y) in the main surface 10s of the substrate 10 can be immediately obtained by the formula (1). For example, in the semiconductor device selecting step S500, the user provided with to whom the substrate 10 or the semiconductor laminate 30 has been provided can refer to the off-angle ($\theta_m$, $\theta_a$) at an arbitrary position (x, y) in the main surface 10s of the substrate 10 without measuring the off-angle of the entire substrate 10.

(d) The off-angle ($\theta_m$, $\theta_a$) in the main surface 10s of the substrate 10 is approximately represented by the formula (1), so that a range of the main surface 10s of the substrate 10 can be displayed on the off-angle coordinate map 20 wherein the off-angle m-axis component $\theta_m$ and the off-angle a-axis component $\theta_a$ are coordinate axes.

Incidentally, when the off-angles are discretely distributed within the main surface of the substrate or non-linearly distributed with respect to the position of the main surface of the substrate, there is a possibility that the range of the main surface of the substrate cannot be displayed on the off-angle coordinate map in correspondence with the range of the main surface of the actual substrate. Therefore, it is difficult to grasp how the off-angles are distributed within the main surface of the substrate.

In contrast, in this embodiment, the off-angle ($\theta_m$, $\theta_a$) in the main surface 10s of the substrate 10 is approximately represented by the formula (1), so that the range of the main surface 10s of the substrate 10 can be displayed on the off-angle coordinate map 20 in correspondence with the range of the main surface 10s of the actual substrate 10. Thereby, it is possible to easily grasp the off-angle distribution in the main surface 10s of the substrate 10. For example, in the off-angle coordinate map 20, when the range of the main surface 10s of the substrate 10 is large, it can be grasped that the off-angle distribution of the main surface 10s of the substrate 10 is wide. On the other hand, when the range of the main surface 10s of the substrate 10 is small, it can be grasped that the off-angle distribution of the main surface 10s of the substrate 10 is narrow.

(e) In the off-angle coordinate map 20, the range of the main surface 10s of the substrate 10 is displayed, so that it is possible to easily grasp the surface morphology distribution of the semiconductor layer 50 in a range of the main surface 10s of the substrate 10, so as to correspond to the dependence of the surface morphology of the semiconductor layer 50 on the off-angle of the main surface 10s of the substrate 10. In other words, the surface morphology of the semiconductor layer 50 can be predicted based on the off-angle ($\theta_m$, $\theta_a$) at an arbitrary position (x, y) in the main surface 10s of the substrate 10. Thereby, the semiconductor device 40 where the surface morphology of the semiconductor layer 50 is good can be selected in the semiconductor device selecting step S500 without actually performing the surface morphology measurement (AFM, etc.) of the semiconductor layer 50.

(f) In the substrate 10 of this embodiment, an absolute value of a rate of change in the off-angle m-axis component m, $|M_1|$, is different, for example, from an absolute value of a rate of change in the off-angle a-axis component $\theta_a$, $|A_1|$. Thereby, the range of the main surface 10s of the substrate 10 can be easily adjusted to correspond to a complicated distribution of the good surface morphology region in the off-angle coordinate map 20.

Here, as illustrated in FIG. 4, the present inventors found that in the dependence of the surface morphology of the semiconductor layer on the off-angle of the main surface of the substrate, the good surface morphology region is not necessarily centrally symmetric with respect to the off-angle (0, 0), but shows a complicated distribution. It can be considered that this is because the surface morphology of the semiconductor layer is influenced by not only the off-angle of the substrate, but also a state of a growth furnace during growth of the semiconductor layer, how to place the substrate, a rotating direction of the substrate, a supply direction of gas to the substrate, etc. Since such a dependence of the surface morphology is exhibited, it becomes difficult to widen the good surface morphology region in the main surface of the substrate, when the off-angle distribution in the main surface of the substrate is isotropic (that is, the range of the main surface of the substrate is a true circle on the off-angle coordinate map).

Thus, in this embodiment, since $|M_1| \neq |A_1|$, the off-angle distribution in the main surface 10s of the substrate 10 can be anisotropic, that is, the range of the main surface 10s of the substrate 10 can be an ellipse on the off-angle coordinate map 20. Thereby, it is possible to easily adjust the off-angle distribution in the main surface 10s of the substrate 10, so as to correspond to the complicated distribution of the good surface morphology region on the off-angle coordinate map 20. As a result, the portion where the surface morphology of the semiconductor layer is good can be widened efficiently in the main surface 10s of the substrate 10.

(g) Furthermore, in the substrate 10 of this embodiment, the absolute value of the rate of change in the off-angle m-axis component $\theta_m$, $|M_1|$, is smaller than, for example, the absolute value of the rate of change in the off-angle a-axis component $\theta_a$, $|A_1|$. Here, in the good surface morphology region of the off-angle coordinate map 20 described above, there are many regions that are short in the m-axis direction and long in the $\theta_a$-axis direction. Therefore, in this embodiment, since $|M_1| < |A_1|$, the range of the main surface 10s of the substrate 10 can be easily adjusted to correspond to the region that is short in the m-axis direction and long in the $\theta_a$-axis direction among the good surface morphology regions in the off-angle coordinate map 20. As a result, the portion where the surface morphology of the semiconductor layer is good can be widened more efficiently in the main surface 10s of the substrate 10.

(h) The off-angle $(\theta_m, \theta_a)$ in at least a part of the main surface 10s of the substrate 10 of this embodiment is included in at least any one of regions A, B, and C. Thereby, the portion where the surface morphology of the semiconductor layer 50 is good can be obtained from at least a part of the semiconductor laminate 30 in which the substrate 10 is used. Since the semiconductor device 40 is fabricated from the portion where the surface morphology of the semiconductor layer 50 is good, it is possible to suppress local electric field concentration on the surface of the semiconductor layer 50. As a result, the withstand voltage of the semiconductor device 40 can be improved.

(i) In this embodiment, at arbitrary position in the main surface 10s of the substrate 10, an error of the off-angle actually measured with respect to the off-angle obtained by the formula (1), $\Delta\theta$, is within ±0.12°. Thereby, it is possible to suppress the range of the main surface 10s of the substrate 10 based on the off-angle actually measured from being excessively wider than the range of the main surface 10s of the substrate 10 obtained by the formula (1) in the off-angle coordinate map 20. As a result, it is possible to suppress the off-angle $(\theta_m, \theta_a)$ in at least a part of the main surface 10s of the actual substrate 10 from deviating from the aforementioned region A, B, or C.

Other Embodiments

Embodiments of the present invention have been specifically described above. However, the present invention is not limited to the aforementioned embodiments, and can be variously modified in a range not departing from the gist of the invention.

The aforementioned embodiments have been described for the case where the substrate 10 is a GaN free-standing substrate. However, the substrate 10 is not limited to the GaN free-standing substrate. For example, the substrate 10 may be the free-standing substrate including a group III nitride semiconductor such as aluminum nitride (AN), aluminum gallium nitride (AlGaN), indium nitride (InN), indium gallium nitride (InGaN), or aluminum indium gallium nitride (AlInGaN), that is, a group III nitride semiconductor represented by a composition formula of $Al_xIn_yGa_{1-x-y}N$ ($0 \leq x \leq 1$, $0 \leq y \leq 1$, $0 \leq x+y \leq 1$).

The aforementioned embodiments have been described for the case where the substrate 10 is n-type. However, the substrate 10 may be p-type, or may have semi-insulating property. For example, in the case of manufacturing a semiconductor device as a high electron mobility transistor (HEMT) using the substrate 10, it is preferable that the substrate 10 has the semi-insulating property.

The aforementioned embodiments have been described for the case where the semiconductor layer 50 includes GaN. However, the semiconductor layer 50 is not limited to include GaN, and the semiconductor layer 50 may include, for example, a group III nitride semiconductor such as AlN, AlGaN, InN, InGaN, or AlInGaN, that is, a group III nitride semiconductor represented by a composition formula of $Al_xIn_yGa_{1-x-y}N$ ($0 \leq x \leq 1$, $0 \leq y \leq 1$, $0 \leq x+y \leq 1$).

The aforementioned embodiments have been described for the case where the semiconductor layer 50 includes the same group III nitride semiconductor as that of the substrate 10. However, at least one of the semiconductor layers 50 may include a group III nitride semiconductor different from that of the substrate 10.

The aforementioned embodiments have been described for the case where the semiconductor device 40 fabricated from the semiconductor laminate 30 is SBD. However, the semiconductor device 40 may be the one other than SBD. Specifically, the semiconductor device 40 may be, for example, a pn junction diode, a junction barrier Schottky diode, HEMT, or the like.

In the case that the semiconductor device 40 is a pn junction diode as a light emitting element and the light emitting layer includes In, since the off-angle distribution (variation in the off-angle) in the main surface 10s of the substrate 10 is adjusted within a predetermined range, it is possible to suppress the variation in the In content in the light emitting layer.

The aforementioned embodiments have been described for the case where the absolute value of a rate of change in the off-angle m-axis component $\theta_m$, $|M_1|$, is smaller than the absolute value of a rate of change in the off-angle a-axis component $\theta_a$, $|A_1|$. However, the absolute value of the rate of change in the off-angle a-axis component $\theta_a$, $|A_1|$, may be smaller than the absolute value of the rate of change in the off-angle m-axis component $\theta_m$, $|M_1|$. Thereby, in the off-angle coordinate map 20, the range of the main surface 10s of the substrate 10 can be easily adjusted so as to correspond to the region that is short in the $\theta_a$-axis direction and long in the $\theta_m$-axis direction in the good surface morphology regions.

The aforementioned embodiments have been described for the case where the substrate 10 is fabricated by the VAS method in the nitride semiconductor substrate fabricating step S100. However, a method other than the VAS method may be used as long as it is a method for fabricating the substrate 10 by using a heterogeneous substrate including a material different from that of the group III nitride semiconductor and by peeling the crystal layer from the heterogeneous substrate.

The aforementioned embodiments have been described for the case where the second crystal layer 6 is sliced using a wire saw in the slicing step S170. However, for example, an outer peripheral blade slicer, an inner peripheral blade slicer, an electric discharge machine, or the like may be used.

The aforementioned embodiments have been described for the case where (a) a method of utilizing the direction dependence of the warpage of the second crystal layer 6 in the peeling step S160, (b) a method of utilizing the direction dependence of the wire saw in the slicing step S170, and (c) a method of making the attachment surface of the holder 82 an elliptical spherical surface in the polishing step S180 are used as methods to attain $|M_1| \neq |A_1|$. However, as the method to attain $|M_1| \neq |A_1|$, at least any one of the methods (a), (b), and (c) may be used.

The aforementioned embodiments have been described for the case where the semiconductor laminate 30 is provided to the user side together with the substrate data output program and the semiconductor device selection program, and, after the semiconductor device fabricating step S400, the off-angle outputting step S520, the map displaying step S540, and the good product determining step S560 are performed as the semiconductor device selecting step S500 on the user side, but are not limited thereto. In addition to the aforementioned cases, for example, the following two modified examples can be contemplated.

In modified example 1, first, the off-angle outputting step S520 and the map displaying step S540 are performed after the nitride semiconductor substrate fabricating step S100 or the semiconductor laminate fabricating step S300, to obtain the off-angle coordinate map 20. After the off-angle coordinate map 20 is obtained, the semiconductor laminate 30 is provided to the user side together with, for example, the off-angle coordinate map 20. Next, the semiconductor device fabricating step S400 is performed on the user side. After the semiconductor device fabricating step S400, the good product determining step S560 is performed based on the off-angle coordinate map 20 which has been already provided, without performing the off-angle outputting step S520 and the map displaying step S540.

In modified example 2, after the constants $M_1$, $A_1$, $M_2$, and $A_2$ are obtained in the off-angle measuring step S220, only a semiconductor device selection program is prepared based on the formula (1) including the constants $M_1$, $A_1$, $M_2$, and $A_2$. Namely, a substrate data output program and an off-angle coordinate map 20 are not prepared. After the semiconductor laminate fabricating step S300, the semiconductor laminate 30 is provided to the user side together with the semiconductor device selection program. Next, the semiconductor device fabricating step S400 is performed on the user side. After the semiconductor device fabricating step S400, the good product determining step S560 is performed without performing the off-angle outputting step S520 and the map displaying step S540. In the good product determining step S560, when the off-angle $(\theta_m, \theta_a)$ obtained by the formula (1) satisfies a previously set condition at a predetermined position (x, y) in the main surface 10s of the substrate 10, the semiconductor device 40 at the predetermined position is selectively picked up.

As in modified examples 1 and 2, the program and the like to be provided when the semiconductor laminate 30 is provided to the user side may be appropriately selected, and each step may be modified according to the selected program and the like.

EXAMPLES

Hereinafter, various experimental results which support the effect of the present invention will be described.

(1) Nitride Semiconductor Substrate (1-1) Fabrication of Nitride Semiconductor Substrate Using the VAS method as in the aforementioned embodiment, the nitride semiconductor substrates of Examples 1 to 3 (sometimes referred to as substrates hereafter) having the following constitutions were prepared under almost the same growth conditions.

Constitution of the Substrate

Substrate: GaN free-standing substrate
Diameter of substrate: 4 inches
Thickness of substrate: 400 μm
Conductivity type of substrate: n-type
N-type impurity in substrate: Si
N-type impurity concentration in substrate: (Example 1) Non-doped, (Example 2) $1.21 \times 10^{18}$ cm$^{-3}$, (Example 3) Non-doped
Main surface of substrate: +c-face
Oli-fla of substrate: m-face, i.e., γ=900
X direction of substrate: approximately a-axis direction
Y direction: approximately m-axis direction The thicknesses of the substrates of Examples 1 to 3 were 472 μm, 504 μm, and 501 μm, respectively. Further, the dislocation densities (average dislocation density) in the substrates of Examples 1 to 3 were almost the same with each other, and $1.39 \times 10^6$ cm$^{-2}$. Furthermore, the electron mobilities in the substrates of Examples 1 to 3 were 337 cm²/Vs, 323 cm²/Vs, and 342 cm²/Vs, respectively.

(1-2) Evaluation of Off-Angle of Nitride Semiconductor Substrate

The off-angle $(\theta_m, \theta_a)$ was measured at a plurality of points on each of x-axis and y-axis in the main surface of the substrate of Example 1 to Example 3 by a rocking curve measurement of X-ray diffraction.

(1-3) Result

Figure 13A:
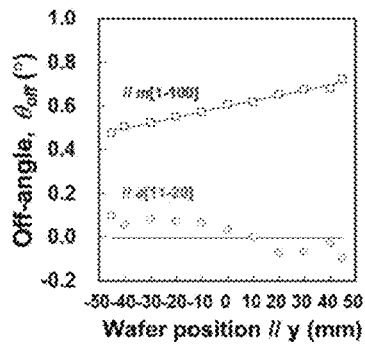
FIG. 13(a) to FIG. 13(f) are views illustrating a result of a measurement of an off-angle with respect to the position on the main surface of the nitride semiconductor substrate in Examples 1 to 3.
Figure 13B:
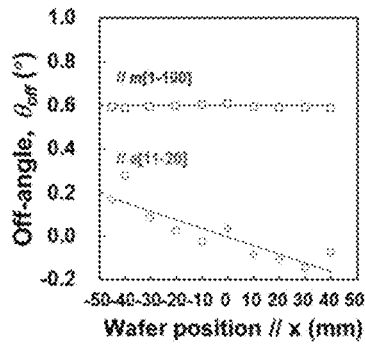
Figure 13C:
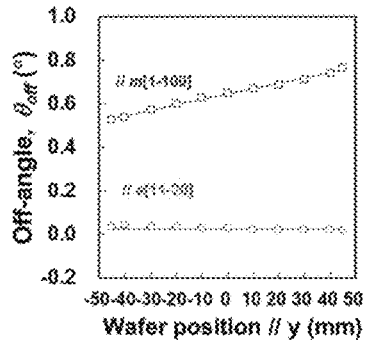
Figure 13D:
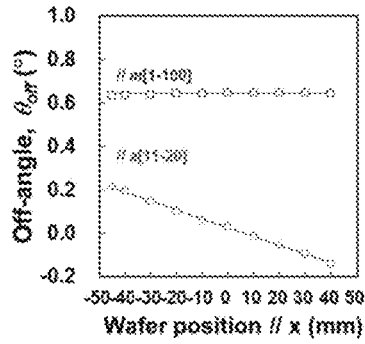
Figure 13E:
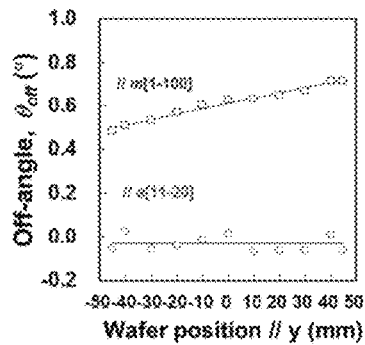
Figure 13F:
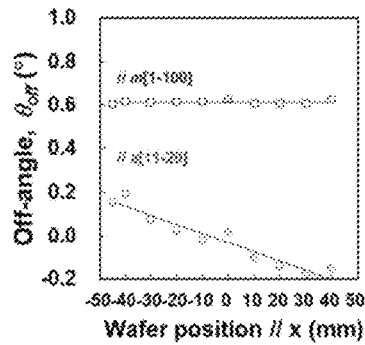

A result of a measurement of an off-angle of the nitride semiconductor substrate in Examples 1 to 3 will be described, with reference to FIG. 13. FIG. 13(a) to FIG. 13(f) are views illustrating a result of a measurement of an off-angle with respect to the position on the main surface of the nitride semiconductor substrate in Example 1 to Example 3. Incidentally, FIG. 13(a) and FIG. 13(b) represent the results of Example 1, FIG. 13(c) and FIG. 13(d) represent the results of Example 2, and FIG. 13(e) and FIG. 13(f) represent the results of Example 3. In figures, "//m[1-100]" represents an off-angle m-axis component $\theta_m$, and open squares represent the actually measured values thereof. Further, "//a[11-20]" represents an off-angle a-axis component $\theta_a$, and open circles represent the actually measured values thereof.

As illustrated in FIG. 13(a), FIG. 13(c), and FIG. 13(e), in each of Example 1 to Example 3, it is confirmed that the off-angle m-axis component $\theta_m$ varies in a substantially linear manner with respect to the position on y-axis. Further, it is confirmed that the off-angle a-axis component $\theta_a$ is substantially constant with respect to the position on y-axis.

As illustrated in FIG. 13(b), FIG. 13(d), and FIG. 13(f), in each of Example 1 to Example 3, it is confirmed that the off-angle a-axis component $\theta_a$ varies in a substantially linear manner with respect to the position on x-axis. Further, it is confirmed that the off-angle m-axis component $\theta_m$ is substantially constant with respect to the position on x-axis.

In Example 1 to Example 3, linear approximation of the off-angle m-axis component $\theta_m$ with respect to the position on y-axis by the least-square method provided the constants $M_1$ and $M_2$ in the formula (1)'. Further, linear approximation of the off-angle a-axis component $\theta_a$ with respect to the position on x-axis by the least-square method provided the constants $A_1$ and $A_2$ in the formula (1)'.

The following Table 1 illustrates constants $M_1$, $A_1$, $M_2$ and $A_2$ of Examples 1 to 3.

TABLE 1

|  | $M_1$ (°/mm) | $A_1$ (°/mm) | $M_2$ (°) | $A_2$ (°) |
| --- | --- | --- | --- | --- |
| Example 1 | 0.0025 | −0.0040 | 0.5994 | −0.0035 |
| Example 2 | 0.0025 | −0.0041 | 0.6453 | 0.0255 |
| Example 3 | 0.0025 | −0.0042 | 0.6105 | −0.0329 |

FIG. 13(a), FIG. 13(c), and FIG. 13(e) illustrate an straight line which approximates the off-angle m-axis component $\theta_m$ with respect to the position on y-axis (linear function of y), and a straight line wherein the off-angle a-axis component $\theta_a$ is $A_2$ (constant function). FIG. 13(b), FIG. 13(d), and FIG. 13(f) illustrate an straight line which approximates the off-angle a-axis component $\theta_a$ with respect to the position on x-axis (linear function of x), and a straight line (constant function) wherein the off-angle m-axis component $\theta_m$ is $M_2$.

The following Table 2 illustrates a maximum absolute value of an error of the off-angle m-axis component $\theta_m$ actually measured with respect to the off-angle m-axis component $\theta_m$ obtained by the formula (1)' ($\theta_m$ maximum error), and a maximum absolute value of an error of the off-angle a-axis component $\theta_a$ actually measured with respect to the off-angle a-axis component $\theta_a$ obtained by the formula (1)' ($\theta_a$ maximum error), in each of Example 1 to Example 3.

TABLE 2

|  |  | y direction | x direction |
| --- | --- | --- | --- |
| Example 1 | $\theta_m$ maximun error | 0.0185 | 0.0145 |
|  | $\theta_a$ maximun error | 0.1011 | 0.1189 |
| Example 2 | $\theta_m$ maximun error | 0.0080 | 0.0110 |
|  | $\theta_a$ maximun error | 0.0161 | 0.0082 |
| Example 3 | $\theta_m$ maximun error | 0.0195 | 0.0195 |
|  | $\theta_a$ maximun error | 0.0593 | 0.0557 |

As illustrated in Table 2, in Example 1 to Example 3, each of the $\theta_m$ maximum error and the $\theta_a$ maximum error was 0.12° or less. That is, in Example 1 to Example 3, it is confirmed that an error of the off-angle actually measured with respect to the off-angle obtained by the formula (1), $\Delta\theta$, is within ±0.12°. Therefore, in Example 1 to Example 3, it is confirmed that the c-face of the substrate is approximated to a spherical surface with high accuracy in each of its cross-sections along m-axis and along a-axis.

Further, in Example 1 to Example 3, the $\theta_m$ maximum error was about 0.02°, whereas the $\theta_a$ maximum error was about 0.12°. That is, in Example 1 to Example 3, it is confirmed that, at the center of the main surface of the substrate, $\theta_m > \theta_a$ (i.e., $M_2 > A_2$), and the $\theta_m$ maximum error is smaller than the $\theta_a$ maximum error.

Figure 14:
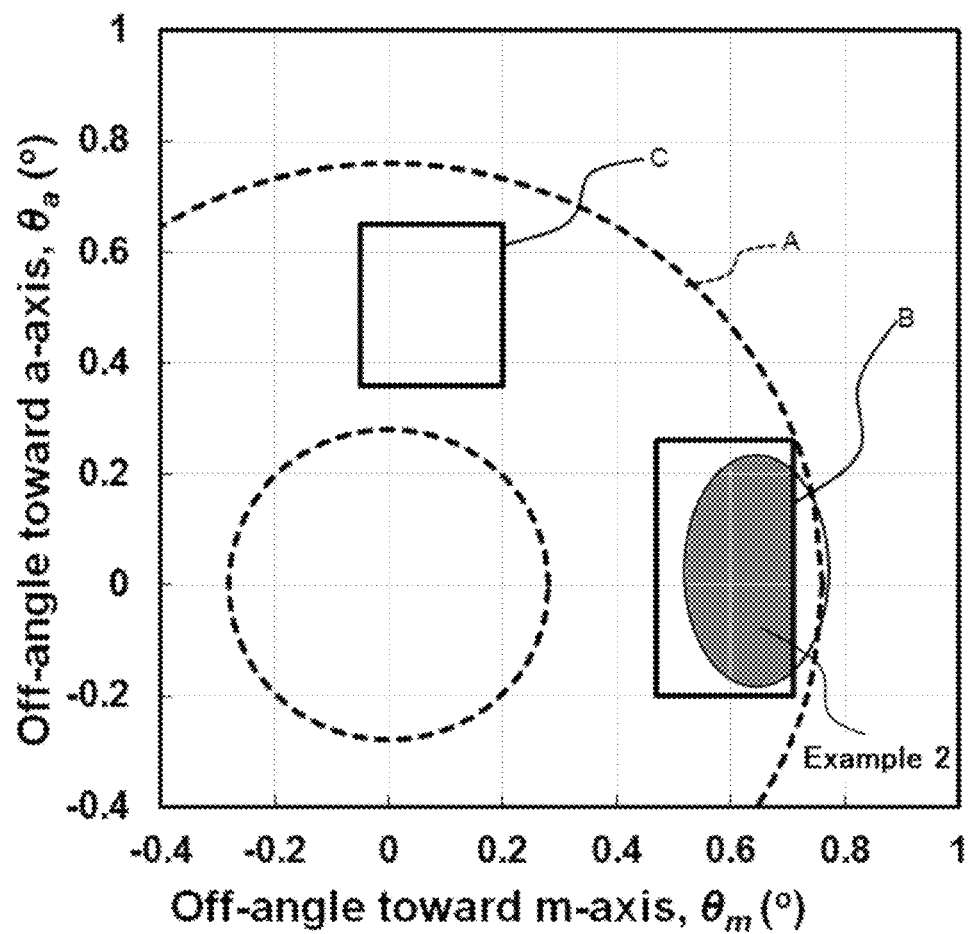
FIG. 14 is an off-angle coordinate map illustrating a relation between the range of the main surface of the nitride semiconductor substrate according to Example 2 and the regions A, B, and C.

Next, the off-angle coordinate map for Example 2 will be described as a representative example, with reference to FIG. 14. FIG. 14 is an off-angle coordinate map illustrating a relation between the range of the main surface of the nitride semiconductor substrate according to Example 2 and the regions A, B, and C.

As illustrated in FIG. 14, it is confirmed that the off-angle ($\theta_m$, $\theta_a$) at an arbitrary position (x, y) in the main surface of the substrate in Example 2 is approximately represented by the formula (1)' using the aforementioned constants $M_1$, $A_1$, $M_2$, and $A_2$, so that a range of the main surface of the substrate of Example 2 can be displayed on the off-angle coordinate map.

Further, it is confirmed that the off-angle ($\theta_m$, $\theta_a$) at least at a part of the main surface of the substrate of Example 2 is included in region A and satisfies the aforementioned formula (2). Moreover, it is confirmed that the off-angle ($\theta_m$, $\theta_a$) at least at the center of the main surface of the substrate of Example 2, that is, ($M_2$, $A_2$), is, for example, included in region A and satisfies the aforementioned formula (2). Furthermore, it is confirmed that the proportion of the area of the region where the off-angle ($\theta_m$, $\theta_a$) satisfies the formula (2) with respect to the total area of the main surface of the substrate of Example 2 is more than 50%, preferably 90% or more.

It is confirmed that the off-angle ($\theta_m$, $\theta_a$) at least at a part of the main surface of the substrate of Example 2 is included in region B and satisfies the aforementioned formulas (3-1) and (3-2). Moreover, it is confirmed that the off-angle ($\theta_m$, $\theta_a$) at least at the center of the main surface of the substrate of Example 2, that is, ($M_2$, $A_2$), is, for example, included in region B and satisfies the aforementioned formulas (3-1) and (3-2). Furthermore, it is confirmed that the proportion of the area of the region (colored region) where the off-angle ($\theta_m$, $\theta_a$) satisfies the formulas (3-1) and (3-2) with respect to the total area of the main surface of the substrate of Example 2 is more than 50%, preferably 80% or more.

Although not illustrated in figures, it is confirmed that the off-angle coordinate maps in Examples 1 and 3 are similar to the off-angle coordinate map in Example 2.

(2) Semiconductor Laminate and Semiconductor Device (2-1) Fabrication of Semiconductor Laminate and Semiconductor Device The semiconductor laminate having the following constitution was fabricated using the substrate of Example 2.

Constitution of the Semiconductor Laminate

Structure of layer: (from the substrate side) base n-type semiconductor layer, drift layer
Constitution of base n-type semiconductor layer: Si-doped GaN layer Si concentration in base n-type semiconductor layer: $2 \times 10^{18}$ cm$^{-3}$ Thickness of base n-type semiconductor layer: 2 μm
Constitution of drift layer: Si-doped GaN layer
Si concentration in drift layer: $0.9 \times 10^{16}$ cm$^{-3}$
Thickness of drift layer: 13 μm Further, the semiconductor device as the SBD having the following constitution was fabricated using the semiconductor laminate of Example 2.

(Constitution of Semiconductor Device)
P-type electrode: Pd/Ni film
Diameter of p-type electrode: 100 μm
N-type electrode: Ti/Al film (2-2) Evaluation The surface morphology of the semiconductor layer was measured by AFM in the predetermined region of the semiconductor laminate of Example 2.

In the semiconductor device of Example 2, a reverse bias was applied and the dielectric breakdown withstand voltage (hereinafter, abbreviated as withstand voltage) was measured.

(2-3) Result

In the semiconductor laminate of Example 2, it is confirmed that the surface roughness Ra of the semiconductor layer is about 7 nm in the region where the off-angle $(\theta_m, \theta_a)$ of the substrate satisfies the formulas (3-1) and (3-2). That is, it is confirmed that the surface morphology of the semiconductor layer is good in the region where the off-angle $(\theta_m, \theta_a)$ of the substrate satisfies the formulas (3-1) and (3-2).

In the semiconductor device of Example 2, it is confirmed that the withstand voltage is at least 1 kV or more in the region where the off-angle $(\theta_m, \theta_a)$ of the substrate satisfies the formulas (3-1) and (3-2). That is, in the region, it is confirmed that since the surface roughness of the semiconductor device is small, it is possible to suppress local electric field concentration and to improve the withstand voltage of the semiconductor device.

Preferable Aspects of the Present Invention

Preferable aspects of the present invention will be supplementarily described hereafter.

Supplementary Description 1

A nitride semiconductor substrate including a group III nitride semiconductor crystal and having a main surface,
wherein a low index crystal plane nearest to the main surface is (0001) plane curved in a concave spherical shape with respect to the main surface, and
the off-angle $(\theta_m, \theta_a)$ at a position (x, y) in the main surface is approximated by the following formula (1):

[Formula 4]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, a represents a direction component along <11-20> axis in the off-angle, $(M_1, A_1)$ represents a rate of change in the off-angle $(\theta_m, \theta_a)$ with respect to the position (x, y) in the main surface, and $(M_2, A_2)$ represents the off-angle $(\theta_m, \theta_a)$ at the center of the main surface.

Supplementary Description 2

The nitride semiconductor substrate according to the supplementary description 1,
wherein an absolute value of a rate of change in the $\theta_m$, $|M_1|$, is different from an absolute value of a rate of change in the $\theta_a$, $|A_1|$.

Supplementary Description 3

The nitride semiconductor substrate according to supplementary description 2,
wherein the absolute value of the rate of change in the $\theta_m$, $|M_1|$, is smaller than the absolute value of the rate of change in the $\theta_a$, $|A_1|$.

Supplementary Description 4

The nitride semiconductor substrate according to any one of the supplementary descriptions 1 to 3,
wherein the main surface does not include a region where the off-angle $(\theta_m, \theta_a)$ is (0, 0).

Supplementary Description 5

The nitride semiconductor substrate according to any one of the supplementary descriptions 1 to 4,
wherein the off-angle $(\theta_m, \theta_a)$ at least at a part of the main surface satisfies the following formula (2):

$$0.0784 \leq \theta_m^2 + \theta_a^2 \leq 0.578 \quad (2)$$

Supplementary Description 6

The nitride semiconductor substrate according to the supplementary description 5, wherein the off-angle $(\theta_m, \theta_a)$ at least at the center of the main surface satisfies the formula (2).

Supplementary Description 7

The nitride semiconductor substrate according to the supplementary description 5 or 6,
wherein a proportion of an area of a region where the off-angle $(\theta_m, \theta_a)$ satisfies the formula (2) with respect to a total area of the main surface is more than 50%.

Supplementary Description 8

The nitride semiconductor substrate according to any one of the supplementary descriptions 1 to 4,
wherein the off-angle ($\theta_m$, $\theta_a$) at least at a part of the main surface satisfies the following formulas (3-1) and (3-2):

$$0.47 \leq \theta_m \leq 0.71 \quad (3-1)$$

$$-0.20 \leq \theta_a \leq 0.26 \quad (3-2)$$

Supplementary Description 9

The nitride semiconductor substrate according to the supplementary description 8,
wherein the off-angle ($\theta_m$, $\theta_a$) at least at the center of the main surface satisfies the formulas (3-1) and (3-2).

Supplementary Description 10

The nitride semiconductor substrate according to the supplementary description 8 or 9,
wherein a proportion of an area of a region where the off-angle ($\theta_m$, $\theta_a$) satisfies the formulas (3-1) and (3-2) with respect to a total area of the main surface is more than 50%.

Supplementary Description 11

The nitride semiconductor substrate according to any one of the supplementary descriptions 1 to 10,
wherein the $\theta_m$ at the center of the main surface is larger than the $\theta_a$ at the center of the main surface, and
a maximum absolute value of an error of the $\theta_m$ actually measured with respect to the $\theta_m$ obtained by the formula (1) is smaller than a maximum absolute value of an error of the $\theta_a$ actually measured with respect to the $\theta_a$ obtained by the formula (1).

Supplementary Description 12

The nitride semiconductor substrate according to any one of the supplementary descriptions 1 to 4,
wherein the off-angle ($\theta_m$, $\theta_a$) at least at a part of the main surface satisfies the following formulas (4-1) and (4-2):

$$-0.05 \leq \theta_m \leq 0.21 \quad (4-1)$$

$$0.36 \leq \theta_a \leq 0.65 \quad (4-2)$$

Supplementary Description 13

The nitride semiconductor substrate according to the supplementary description 12,
wherein the off-angle ($\theta_m$, $\theta_a$) at least at the center of the main surface satisfies the formulas (4-1) and (4-2).

Supplementary Description 14

The nitride semiconductor substrate according to the supplementary description 12 or 13,
wherein a proportion of an area of a region where the off-angle ($\theta_m$, $\theta_a$) satisfies the formulas (4-1) and (4-2) with respect to a total area of the main surface is more than 50%.

Supplementary Description 15

The nitride semiconductor substrate according to any one of the supplementary descriptions 1 to 7, and 12 to 14,
wherein the $\theta_a$ at the center of the main surface is larger than the m at the center of the main surface,
a maximum absolute value of an error of the $\theta_a$ actually measured with respect to the $\theta_a$ obtained by the formula (1) is smaller than a maximum absolute value of an error of the $\theta_m$ actually measured with respect to the $\theta_m$ obtained by the formula (1).

Supplementary Description 16

The nitride semiconductor substrate according to any one of the supplementary descriptions 1 to 15,
wherein an error of the off-angle actually measured with respect to the off-angle obtained by the formula (1) at arbitrary position in the main surface is within ±0.12°.

Supplementary Description 17

The nitride semiconductor substrate according to the supplementary description 16,
wherein the error is within ±0.06°.

Supplementary Description 18

A nitride semiconductor substrate including a group III nitride semiconductor crystal, and having a main surface and an orientation flat constituting a part of a side surface connected to the main surface,
wherein a low index crystal plane nearest to the main surface is (0001) plane curved in a concave spherical shape with respect to the main surface, and
the off-angle ($\theta_m$, $\theta_a$) at a position (x, y) in the main surface is approximated by the following formula (1)':

[Formula 5]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} \cos \gamma & -\sin \gamma & 0 \\ \sin \gamma & \cos \gamma & 0 \\ 0 & 0 & 1 \end{pmatrix} \begin{pmatrix} x \\ y \\ 1 \end{pmatrix} \quad (1)'$$

where x represents a coordinate in a direction parallel to the orientation flat as a position in the main surface, y represents a coordinate in a direction perpendicular to the orientation flat as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, ($M_2$, $A_2$) represents the off-angle ($\theta_m$, $\theta_a$) at the center of the main surface, and $\gamma$ represents an angle of the orientation flat with respect to (11-20) plane of the crystal.

Supplementary Description 19

A semiconductor laminate including:
a nitride semiconductor substrate including a group III nitride semiconductor crystal and having a main surface, and
a semiconductor layer including a group III nitride semiconductor, provided on the nitride semiconductor substrate, wherein a low index crystal plane nearest to the main surface of the nitride semiconductor substrate is (0001) plane curved in a concave spherical shape with respect to the main surface, and in the nitride semiconductor substrate, the off-angle ($\theta_m$, $\theta_a$) at a position (x, y) in the main surface is approximated by the following formula (1):

[Formula 6]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface.

Supplementary Description 20

The semiconductor laminate according to the supplementary description 19,
wherein a proportion of an area of a region where the off-angle ($\theta_m$, $\theta_a$) satisfies the formulas (3-1) and (3-2) with respect to a total area of the main surface of the nitride semiconductor substrate is more than 50%, and
a proportion of an area of a region where an arithmetic average roughness Ra of the main surface of the semiconductor layer is 30 nm or less with respect to the total area of the main surface of the semiconductor layer is more than 50%:

$$0.47 \leq \theta_m \leq 0.71 \quad (3\text{-}1)$$

$$-0.20 \leq \theta_a \leq 0.26 \quad (3\text{-}2)$$

Supplementary Description 21

The semiconductor laminate according to the supplementary description 19,
wherein a proportion of an area of a region where the off-angle ($\theta_m$, $\theta_a$) satisfies the formulas (4-1) and (4-2) with respect to a total area of the main surface of the nitride semiconductor substrate is more than 50%, and
a proportion of an area of a region where an arithmetic average roughness Ra of the main surface of the semiconductor layer is 30 nm or less with respect to the total area of the main surface of the semiconductor layer is more than 50%:

$$-0.05 \leq \theta_m \leq 0.21 \quad (4\text{-}1)$$

$$0.36 \leq \theta_a \leq 0.65 \quad (4\text{-}2)$$

Supplementary Description 22

A substrate selection program for making a computer execute selection of a nitride semiconductor substrate including a group III nitride semiconductor crystal and having a main surface, after fabrication of the nitride semiconductor substrate;

wherein the nitride semiconductor substrate is constituted so that:

a low index crystal plane nearest to the main surface is (0001) plane curved with respect to the main surface, and the off-angle ($\theta_m$, $\theta_a$) at a position (x, y) in the main surface is approximated by the following formula (1):

[Formula 7]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, a represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface;

the substrate selection program making the computer execute the procedure of ranking and selecting the nitride semiconductor substrate based on the proportion of the area of the region where the off-angle ($\theta_m$, $\theta_a$) obtained by formula (1) satisfies a predetermined condition in the main surface with respect to the total area of the main surface;

or a non-transitory computer-readable recording medium having the program stored therein.

Supplementary Description 23

The substrate selection program, or recording medium according to the supplementary description 22,
for making the computer execute a procedure of setting a price of the nitride semiconductor substrate based on a rank given to the nitride semiconductor substrate.

Supplementary Description 24

The substrate selection program, or recording medium according to the supplementary description 22 or 23,
wherein, in the procedure of selecting the nitride semiconductor substrate, the nitride semiconductor substrate is ranked as a good product when a proportion of an area of a region where the off-angle ($\theta_m$, $\theta_a$) satisfies the following formula (2) with respect to the total area of the main surface of the nitride semiconductor substrate is a predetermined value or more:

$$0.0784 \leq \theta_m^2 + \theta_a^2 \leq 0.5625 \quad (2)$$

Supplementary Description 25

The substrate selection program, or recording medium according to the supplementary description 22 or 23,
wherein, in the procedure of selecting the nitride semiconductor substrate, the nitride semiconductor substrate is ranked as a good product when a proportion of an area of a region where the off-angle ($\theta_m$, $\theta_a$) satisfies the following formulas (3-1) and (3-2) with respect to the total area of the main surface of the nitride semiconductor substrate is a predetermined value or more:

$$0.47 \leq \theta_m \leq 0.71 \quad (3\text{-}1)$$

$$-0.20 \leq \theta_a \leq 0.26 \quad (3\text{-}2)$$

Supplementary Description 26

The substrate selection program, or recording medium according to the supplementary description 22 or 23,
wherein, in the procedure of selecting the nitride semiconductor substrate, the nitride semiconductor substrate is ranked as a good product when a proportion of an area of a region where the off-angle ($\theta_m$, $\theta_a$) satisfies the following formulas (4-1) and (4-2) with respect to the total area of the main surface of the nitride semiconductor substrate is a predetermined value or more:

$$-0.05 \leq \theta_m \leq 0.2 \quad (4\text{-}1)$$

$$0.36 \leq \theta_a \leq 0.65 \quad (4\text{-}2)$$

Supplementary Description 27

A substrate data output program provided along with a nitride semiconductor substrate including a group III nitride semiconductor crystal and having a main surface, for making a computer execute output of data regarding a state of the main surface of the nitride semiconductor substrate;
wherein the nitride semiconductor substrate is constituted so that:
a low index crystal plane nearest to the main surface is (0001) plane curved with respect to the main surface, and
the off-angle ($\theta_m$, $\theta_a$) at a position (x, y) in the main surface is approximated by the following formula (1):

[Formula 8]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface;
the program making the computer execute a procedure of outputting the off-angle ($\theta_m$, $\theta_a$) at the position (x, y) by the formula (1) when an arbitrary position (x, y) in the main surface is input;
or a non-transitory computer-readable recording medium having the program stored therein.

Supplementary Description 28

The substrate data output program, or recording medium according to the supplementary description 27,
for making the computer execute a procedure of displaying an off-angle coordinate map wherein the $\theta_m$ and the $\theta_a$ are coordinate axes, and displaying a range of the main surface on the off-angle coordinate map based on the off-angle ($\theta_m$, $\theta_a$) at a position (x, y) on an outer edge of the main surface, output by the formula (1).

Supplementary Description 29

The substrate data output program, or recording medium according to the supplementary description 28,
wherein, in the procedure of displaying the range of the main surface, the region where the off-angle ($\theta_m$, $\theta_a$) satisfies the following formula (2) is displayed on the off-angle coordinate map:

$$0.0784 \leq \theta_m^2 + \theta_a^2 \leq 0.5625 \quad (2)$$

Supplementary Description 30

The substrate data output program, or recording medium according to the supplementary description 28,
wherein, in the procedure of displaying the range of the main surface, the region where the off-angle ($\theta_m$, $\theta_a$) satisfies the following formulas (3-1) and (3-2) is displayed on the off-angle coordinate map:

$$0.47 \leq \theta_m \leq 0.71 \quad (3\text{-}1)$$

$$-0.20 \leq \theta_a \leq 0.26 \quad (3\text{-}2)$$

Supplementary Description 31

The substrate data output program, or recording medium according to the supplementary description 28,
wherein, in the procedure of displaying the range of the main surface, the region where the off-angle ($\theta_m$, $\theta_a$) satisfies the following formulas (4-1) and (4-2) is displayed on the off-angle coordinate map:

$$-0.05 \leq \theta_m \leq 0.2 \quad (4\text{-}1)$$

$$0.36 \leq \theta_a \leq 0.65 \quad (4\text{-}2)$$

Supplementary Description 32

A nitride semiconductor substrate provided with a substrate output program,
which is provided along with the substrate data output program according to any one of the supplementary descriptions 27 to 31.

Supplementary Description 33

An off-angle coordinate map output by the substrate data output program according to any one of the supplementary descriptions 28 to 31.

Supplementary Description 34

A nitride semiconductor substrate provided with an off-angle coordinate map,
which is provided along with the off-angle coordinate map according to the supplementary description 33.

Supplementary Description 35

A semiconductor device selection program for making a computer cause a pick-up apparatus to execute selective pick-up of a semiconductor device, when the semiconductor device is manufactured using a nitride semiconductor substrate including a group III nitride semiconductor crystal and having a main surface;
wherein the nitride semiconductor substrate is constituted so that:
a low index crystal plane nearest to the main surface is (0001) plane curved with respect to the main surface, and
the off-angle ($\theta_m$, $\theta_a$) at a position (x, y) in the main surface is approximated by the following formula (1):

[Formula 9]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface;
the substrate selection program making the computer cause the pick-up apparatus to execute the procedure of selectively picking up the semiconductor device at a predetermined position as a good product when the off-angle ($\theta_m$, $\theta_a$) obtained at the predetermined position (x, y) in the main surface by the formula (1) satisfies a predetermined condition;
or a non-transitory computer-readable recording medium having the program stored therein.

Supplementary Description 36

A nitride semiconductor substrate provided with a semiconductor device selection program, which is provided along with the semiconductor device selection program according to the supplementary description 35.

Supplementary Description 37

A manufacturing method of a nitride semiconductor substrate, including
fabricating a nitride semiconductor substrate including a group III nitride semiconductor crystal and having a main surface,
wherein, in the fabrication of the nitride semiconductor substrate, the nitride semiconductor substrate is fabricated so that:
a low index crystal plane nearest to the main surface is (0001) plane curved in a concave spherical shape with respect to the main surface, and
the off-angle ($\theta_m$, $\theta_a$) at a position (x, y) in the main surface is approximated by the following formula (1):

[Formula 10]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, a represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface.

Supplementary Description 38

The manufacturing method of a nitride semiconductor substrate according to the supplementary description 37,
wherein the fabrication of the nitride semiconductor substrate includes:
growing a first crystal layer including a group III nitride semiconductor crystal on a crystal growth substrate,
forming a metal layer on the first crystal layer,
performing a heat treatment in an atmosphere containing hydrogen gas or hydride gas to form voids in the first crystal layer,
growing a second crystal layer including a group III nitride semiconductor crystal on the first crystal layer and the metal layer, and
peeling the second crystal layer from the substrate,
wherein, in the formation of voids in the first crystal layer, a void formation rate indicative of a proportion in volume of the voids in the first crystal layer is made concentrically equal in the circumferential direction of a circle or ellipse sharing a center with the crystal growth substrate, and, at the same time, the void formation rate is monotonically increased from the center side toward the outer circumference side in a radial direction of the crystal growth substrate.

Supplementary Description 39

The manufacturing method of a nitride semiconductor substrate according to the supplementary description 38,
wherein, in the growth of the second crystal, an initial nucleus of the second crystal layer is generated according to the void formation rate in the first crystal layer, a density of the initial nucleus is made concentrically equal in the circumferential direction of a circle or ellipse sharing a center with the crystal growth substrate, and, at the same time, the void formation rate is monotonically decreased from the center side toward the outer circumference side in a radial direction of the crystal growth substrate.

Supplementary Description 40

The manufacturing method of a nitride semiconductor substrate according to the supplementary description 38 or 39,
wherein, in the peeling of the second crystal layer from the substrate, the second crystal layer is peeled equally in the circumferential direction of the crystal growth substrate and gradually from the outer circumference side toward the center side in the radial direction of the crystal growth substrate so that the central position of the final contact range between the second crystal layer and the crystal growth substrate is an approximate center of the crystal growth substrate.

Supplementary Description 41

The manufacturing method of a nitride semiconductor substrate according to any one of the supplementary descriptions 37 to 40, including: measuring the off-angles at two or more points in the main surface after the fabrication of the nitride semiconductor substrate, and thus obtaining the $M_1$, the $M_2$, the $A_1$, and the $A_2$ in the formula (1).

Supplementary Description 42

A manufacturing method of a semiconductor laminate, including:
fabricating a nitride semiconductor substrate including a group III nitride semiconductor crystal and having a main surface, and
epitaxially growing a semiconductor layer including a group III nitride semiconductor on the nitride semiconductor substrate to fabricate a semiconductor laminate,
wherein, in the fabrication of the nitride semiconductor substrate, the nitride semiconductor substrate is fabricated so that:
a low index crystal plane nearest to the main surface is (0001) plane curved in a concave spherical shape with respect to the main surface, and
the off-angle ($\theta_m$, $\theta_a$) at a position (x, y) in the main surface is approximated by the following formula (1):

[Formula 11]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, a represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface.

Supplementary Description 43

A manufacturing method of a semiconductor device, including:
fabricating a nitride semiconductor substrate including a group III nitride semiconductor crystal and having a main surface, and
epitaxially growing a semiconductor layer including a group III nitride semiconductor on the nitride semiconductor substrate to fabricate a semiconductor laminate,
cutting the semiconductor laminate to fabricate a semiconductor device, and
selecting the semiconductor device,
wherein, in the fabrication of the nitride semiconductor substrate, the nitride semiconductor substrate is fabricated so that:
a low index crystal plane nearest to the main surface is (0001) plane curved in a concave spherical shape with respect to the main surface, and
the off-angle ($\theta_m$, $\theta_a$) at a position (x, y) in the main surface is approximated by the following formula (1):

[Formula 12]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface;
in the selection of the semiconductor device, the semiconductor device is selected based on the off-angle ($\theta_m$, $\theta_a$) at a position (x, y) in the main surface.

Supplementary Description 44

The manufacturing method of a semiconductor device according to the supplementary description 43,
wherein the selection of the semiconductor device includes:
outputting the off-angle ($\theta_m$, $\theta_a$) at the position (x, y) by the formula (1) when an arbitrary position (x, y) in the main surface is input,
displaying a range of the main surface based on the off-angle ($\theta_m$, $\theta_a$) at a position (x, y) on an outer edge of the main surface, output by the formula (1), on the off-angle coordinate map wherein the $\theta_m$ and the $\theta_a$ are coordinate axes, and, at the same time, displaying a region where the off-angle ($\theta_m$, $\theta_a$) satisfies a predetermined condition on the off-angle coordinate map, and
selecting as a good product the semiconductor device cut out from the region in the main surface, where the off-angle ($\theta_m$, $\theta_a$) satisfies the predetermined condition.

Supplementary Description 45

A substrate data output method for outputting data regarding a state of a main surface of the nitride semiconductor substrate including a group III nitride semiconductor crystal and having the main surface;
wherein the nitride semiconductor substrate is constituted so that:
a low index crystal plane nearest to the main surface is (0001) plane curved with respect to the main surface, and
the off-angle ($\theta_m$, $\theta_a$) at a position (x, y) in the main surface is approximated by the following formula (1):

[Formula 13]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface;
the method including outputting the off-angle ($\theta_m$, $\theta_a$) at the position (x, y) by the formula (1) when an arbitrary position (x, y) in the main surface is input.

DESCRIPTION OF NUMERALS

10 Nitride semiconductor substrate (substrate)
10c c-axis
10f c-face
10s Main surface
20 Off-angle coordinate map
30 Semiconductor laminate
40 Semiconductor device
50 Semiconductor layer

The invention claimed is:

1. A nitride semiconductor substrate comprising a group III nitride semiconductor crystal and having a main surface, wherein a low index crystal plane nearest to the main surface is (0001) plane curved in a concave spherical shape with respect to the main surface, and
the off-angle ($\theta_m$, $\theta_a$) at an arbitrary position (x, y) in the main surface is approximated by the following formula (1):

[Formula 1]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface, and
wherein the off-angle ($\theta_m$, $\theta_a$) at least at a part of positions of the main surface satisfies the following formula (2):

$$0.0784 \leq \theta_m^2 + \theta_a^2 \leq 0.578 \quad (2).$$

2. The nitride semiconductor substrate according to claim 1,
wherein an absolute value of a rate of change in the $\theta_m$, 1, is different from an absolute value of a rate of change in the $\theta_a$, $|A_1|$.

3. The nitride semiconductor substrate according to claim 2,
wherein the absolute value of the rate of change in the $\theta_m$, $|M_1|$, is smaller than the absolute value of the rate of change in the $\theta_a$, $|A_1|$.

4. The nitride semiconductor substrate according to claim 1,
wherein the off-angle ($\theta_m$, $\theta_a$) at least at the center of the main surface satisfies the formula (2).

5. The nitride semiconductor substrate according to claim 1,
wherein a proportion of an area of a region where the off-angle ($\theta_m$, $\theta_a$) satisfies the formula (2) with respect to a total area of the main surface is more than 50%.

6. A nitride semiconductor substrate comprising a group III nitride semiconductor crystal and having a main surface, wherein a low index crystal plane nearest to the main surface is (0001) plane curved in a concave spherical shape with respect to the main surface, and the off-angle ($\theta_m$, $\theta_a$) at an arbitrary position (x, y) in the main surface is approximated by the following formula (1):

[Formula 1]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface, and wherein the off-angle ($\theta_m$, $\theta_a$) at least at a part of positions of the main surface satisfies the following formulas (3-1) and (3-2):

$$0.47 \leq \theta_m \leq 0.71 \quad (3\text{-}1)$$

$$-0.20 \leq \theta_a \leq 0.26 \quad (3\text{-}2).$$

7. The nitride semiconductor substrate according to claim 6,
wherein the off-angle ($\theta_m$, $\theta_a$) at least at the center of the main surface satisfies the formulas (3-1) and (3-2).

8. The nitride semiconductor substrate according to claim 6,
wherein a proportion of an area of a region where the off-angle ($\theta_m$, $\theta_a$) satisfies the formulas (3-1) and (3-2) with respect to a total area of the main surface is more than 50%.

9. The nitride semiconductor substrate according to claim 1,
wherein the $\theta_m$ at the center of the main surface is larger than the $\theta_a$ at the center of the main surface, and
a maximum absolute value of an error of the $\theta_m$ actually measured with respect to the $\theta_m$ obtained by the formula (1) is smaller than a maximum absolute value of an error of the $\theta_a$ actually measured with respect to the $\theta_a$ obtained by the formula (1).

10. A nitride semiconductor substrate comprising a group III nitride semiconductor crystal and having a main surface,
wherein a low index crystal plane nearest to the main surface is (0001) plane curved in a concave spherical shape with respect to the main surface, and
the off-angle ($\theta_m$, $\theta_a$) at an arbitrary position (x, y) in the main surface is approximated by the following formula (1):

[Formula 1]

$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface, and wherein the off-angle ($\theta_m$, $\theta_a$) at least at a part of positions of the main surface satisfies the following formulas (4-1) and (4-2):

$$-0.05 \leq \theta_m \leq 0.21 \quad (4\text{-}1)$$

$$0.36 \leq \theta_a \leq 0.65 \quad (4\text{-}2).$$

11. The nitride semiconductor substrate according to claim 9,
wherein the off-angle ($\theta_m$, $\theta_a$) at least at the center of the main surface satisfies the formulas (4-1) and (4-2).

12. The nitride semiconductor substrate according to claim 9,
wherein a proportion of an area of a region where the off-angle ($\theta_m$, $\theta_a$) satisfies the formulas (4-1) and (4-2) with respect to a total area of the main surface is more than 50%.

13. The nitride semiconductor substrate according to claim 1,
wherein the $\theta_a$ at the center of the main surface is larger than the $\theta_m$ at the center of the main surface,
a maximum absolute value of an error of the $\theta_a$ actually measured with respect to the $\theta_a$ obtained by the formula (1) is smaller than a maximum absolute value of an error of the $\theta_m$ actually measured with respect to the $\theta_m$ obtained by the formula (1).

14. The nitride semiconductor substrate according to claim 1,
wherein an error of the off-angle actually measured with respect to the off-angle obtained by the formula (1) at arbitrary position in the main surface is within ±0.12°.

15. A semiconductor laminate comprising:
the nitride semiconductor substrate according to claim 1, and
a semiconductor layer comprising a group III nitride semiconductor, provided on the nitride semiconductor substrate.

16. A manufacturing method of nitride semiconductor substrate, comprising: fabricating the nitride semiconductor substrate according to claim 1 by a VAS (Void-Assisted Separation) method.

17. A manufacturing method of a semiconductor laminate, comprising:
fabricating the nitride semiconductor substrate according to claim 1 by a VAS (Void-Assisted Separation) method, and
epitaxially growing a semiconductor layer comprising a group III nitride semiconductor on the nitride semiconductor substrate to fabricate a semiconductor laminate.

18. A manufacturing method of a semiconductor device, comprising:
fabricating a nitride semiconductor substrate comprising a group III nitride semiconductor crystal and having a main surface, and
epitaxially growing a semiconductor layer comprising a group III nitride semiconductor on the nitride semiconductor substrate to fabricate a semiconductor laminate,
cutting the semiconductor laminate to fabricate a semiconductor device, and
selecting the semiconductor device,
wherein, in the fabrication of the nitride semiconductor substrate, the nitride semiconductor substrate is fabricated so that:
a low index crystal plane nearest to the main surface is (0001) plane curved in a concave spherical shape with respect to the main surface, and
the off-angle ($\theta_m$, $\theta_a$) at a position (x, y) in the main surface is approximated by the following formula (1):

[Formula 9]
$$\begin{pmatrix} \theta_m \\ \theta_a \\ 1 \end{pmatrix} = \begin{pmatrix} M_1 & 0 & M_2 \\ 0 & A_1 & A_2 \\ 0 & 0 & 1 \end{pmatrix} \begin{pmatrix} x \\ y \\ 1 \end{pmatrix} \quad (1)$$

where x represents a coordinate in a direction along <1-100> axis of the crystal as a position in the main surface, y represents a coordinate in a direction along <11-20> axis of the crystal as a position in the main surface, (0, 0) represents a coordinate (x, y) of the center of the main surface, $\theta_m$ represents a direction component along <1-100> axis in an off-angle of <0001> axis of the crystal with respect to a normal of the main surface, $\theta_a$ represents a direction component along <11-20> axis in the off-angle, ($M_1$, $A_1$) represents a rate of change in the off-angle ($\theta_m$, $\theta_a$) with respect to the position (x, y) in the main surface, and ($M_2$, $A_2$) represents the off-angle ($\theta_m$, $\theta_a$) at the center of the main surface;
in the selection of the semiconductor device, the semiconductor device is selected based on the off-angle ($\theta_m$, $\theta_a$) at a position (x, y) in the main surface.

19. A semiconductor laminate comprising:
the nitride semiconductor substrate according to claim 6, and
a semiconductor layer comprising a group III nitride semiconductor, provided on the nitride semiconductor substrate.

20. A semiconductor laminate comprising:
the nitride semiconductor substrate according to claim 10, and
a semiconductor layer comprising a group III nitride semiconductor, provided on the nitride semiconductor substrate.

21. A manufacturing method of a nitride semiconductor substrate, comprising:
fabricating the nitride semiconductor substrate according to claim 6 by a VAS (Void-Assisted Separation) method.

22. A manufacturing method of a nitride semiconductor substrate, comprising:
fabricating the nitride semiconductor substrate according to claim 10 by a VAS (Void-Assisted Separation) method.

23. A manufacturing method of a semiconductor laminate, comprising:
fabricating the nitride semiconductor substrate according to claim 6 by a VAS (Void-Assisted Separation) method, and
epitaxially growing a semiconductor layer comprising a group III nitride semiconductor on the nitride semiconductor substrate to fabricate a semiconductor laminate.

24. A manufacturing method of a semiconductor laminate, comprising:
fabricating the nitride semiconductor substrate according to claim 10 by a VAS (Void-Assisted Separation) method, and
epitaxially growing a semiconductor layer comprising a group III nitride semiconductor on the nitride semiconductor substrate to fabricate a semiconductor laminate.

* * * * *